(12) United States Patent
Gullapalli et al.

(10) Patent No.: US 12,203,997 B2
(45) Date of Patent: Jan. 21, 2025

(54) TRACKING STATE OF CHARGE OF A NON-RECHARGEABLE BATTERY USING IMPEDANCE SPECTROSCOPY

(71) Applicant: Analog Devices International Unlimited Company, Limerick (IE)

(72) Inventors: Hemtej Gullapalli, Littleton, MA (US); Erfan Soltanmohammadi, Melrose, MA (US); Han Zhang, Belmont, MA (US); Michael W. O'Brien, Cork (IE)

(73) Assignee: Analog Devices International Unlimited Company, Limerick (IE)

(*) Notice: Subject to any disclaimer, the term of this patent is extended or adjusted under 35 U.S.C. 154(b) by 10 days.

(21) Appl. No.: 18/135,072

(22) Filed: Apr. 14, 2023

(65) Prior Publication Data
US 2023/0375627 A1 Nov. 23, 2023

Related U.S. Application Data

(63) Continuation of application No. 17/384,148, filed on Jul. 23, 2021, now Pat. No. 11,662,389.
(Continued)

(51) Int. Cl.
*G01R 31/3835* (2019.01)
*G01K 7/02* (2021.01)
(Continued)

(52) U.S. Cl.
CPC .......... *G01R 31/3835* (2019.01); *G01K 7/02* (2013.01); *G01R 31/367* (2019.01);
(Continued)

(58) Field of Classification Search
None
See application file for complete search history.

(56) References Cited

U.S. PATENT DOCUMENTS

| 3,984,762 A | 10/1976 | Dowgiallo |
| 5,650,937 A | 7/1997 | Bounaga |

(Continued)

FOREIGN PATENT DOCUMENTS

| CN | 106997026 B | 4/2020 |
| DE | 10 2014 217 135 A1 | 3/2021 |

(Continued)

OTHER PUBLICATIONS

International Search Report and Written Opinion for International Application No. PCT/US2021/042970, mailed Oct. 27, 2021.
(Continued)

*Primary Examiner* — Jas A Sanghera
(74) *Attorney, Agent, or Firm* — Wolf, Greenfield & Sacks, P.C.

(57) ABSTRACT

Sensors and methods for determining the state of charge of a battery are described. The state of charge is determined in some instances by applying a current perturbation having a frequency to the battery terminals, monitoring the response signal, and determining the phase of the response signal. The phase may be correlated to the state of charge of the battery, so that once the phase is determined, a determination of the state of charge of the battery may be made. In some situations, the state of charge may be used to determine the operating condition of a load connected to the battery. In some embodiments, the state of charge may be used to determine whether the battery is defective.

20 Claims, 19 Drawing Sheets

Related U.S. Application Data

(60) Provisional application No. 63/056,531, filed on Jul. 24, 2020.

(51) Int. Cl.
*G01R 31/367* (2019.01)
*G01R 31/374* (2019.01)
*G01R 31/378* (2019.01)
*G01R 31/389* (2019.01)

(52) U.S. Cl.
CPC ......... *G01R 31/374* (2019.01); *G01R 31/378* (2019.01); *G01R 31/389* (2019.01)

(56) References Cited

U.S. PATENT DOCUMENTS

| | | | |
|---|---|---|---|
| 6,094,033 | A | 7/2000 | Ding et al. |
| 6,668,247 | B2 | 12/2003 | Singh et al. |
| 8,738,310 | B2 | 5/2014 | Swanton |
| 10,180,464 | B2 | 1/2019 | Saint-Marcoux et al. |
| 10,386,422 | B2 | 8/2019 | Christiansen et al. |
| 2002/0084771 | A1 | 7/2002 | Lundberg |
| 2006/0267554 | A1 | 11/2006 | Cargonja et al. |
| 2010/0055549 | A1 | 3/2010 | Corder |
| 2011/0225436 | A1 | 9/2011 | Beard |
| 2011/0270559 | A1* | 11/2011 | Christophersen .... G01R 31/389 702/65 |
| 2012/0188086 | A1 | 7/2012 | Xie et al. |
| 2013/0229156 | A1 | 9/2013 | Brandon et al. |
| 2016/0069963 | A1 | 3/2016 | Hebiguchi |
| 2018/0059191 | A1 | 3/2018 | Abu Qahouq |
| 2018/0128881 | A1 | 5/2018 | Kelly |
| 2018/0321326 | A1 | 11/2018 | Tanaka et al. |
| 2019/0154764 | A1 | 5/2019 | Schlasza et al. |
| 2020/0006962 | A1 | 1/2020 | Roumi et al. |
| 2020/0014220 | A1 | 1/2020 | Srinivasan et al. |
| 2020/0300920 | A1* | 9/2020 | Christophersen ..... H01M 10/48 |
| 2022/0026496 | A1 | 1/2022 | Gullapalli et al. |

FOREIGN PATENT DOCUMENTS

| | | |
|---|---|---|
| ES | 2 382 272 B1 | 5/2013 |
| FR | 2 737 923 A1 | 2/1997 |
| FR | 2 923 023 A1 | 5/2009 |
| JP | 2014-052186 A | 3/2014 |
| JP | 2014-059174 A | 4/2014 |
| KR | 2014-0066361 A | 6/2014 |

OTHER PUBLICATIONS

International Preliminary Report on Patentability mailed Feb. 2, 2023, in connection with International Application No. PCT/US2021/042970.

Attanayaka et al., Estimation of state of charge for lithium-ion batteries—A Review. AIMS Energy. 2019;7(2):186-210.

Berendes et al., Applied battery diagnosis. Physical Sciences Reviews. Mar. 1, 2019;4(3):20170158.

Bohlen, Impedance-based battery monitoring. Dissertation for Doctorate of Engineering at RWTH Aachen University. Jan. 28, 2008:1-198.

Howey et al., Online measurement of battery impedance using motor controller excitation. IEEE Transactions on Vehicular Technology. Dec. 3, 2013;63(6):2557-66.

Wei et al., Practical on-board measurement of lithium ion battery impedance based on distributed voltage and current sampling. Energies. Jan. 2018;11(1):64.

Wu et al., AC impedance-based online state-of-charge estimation for li-ion battery. 2017 IEEE International Conference on Information, Communication and Engineering (ICICE). Nov. 17, 2017:53-6.

Extended European Search Report dated Jul. 16, 2024 in connection with European Application No. 21847009.4.

Astafev, Wide frequency band electrochemical noise measurement and analysis of a Li/SOCl$_2$ primary battery. J. of Solid Electrochemistry. Nov. 13, 2018;23(2):389-96.

* cited by examiner

TRACKING STATE OF CHARGE OF A NON-RECHARGEABLE BATTERY USING IMPEDANCE SPECTROSCOPY

CROSS-REFERENCE TO RELATED APPLICATIONS

This application is a continuation claiming the benefit under 35 U.S.C. § 120 of U.S. patent application Ser. No. 17/384,148, filed Jul. 23, 2021, and entitled "TRACKING STATE OF CHARGE OF A NON-RECHARGEABLE BATTERY USING IMPEDANCE SPECTROSCOPY", which is hereby incorporated by reference herein in its entirety.

U.S. patent application Ser. No. 17/384,148 claims the benefit under 35 U.S.C. § 119(e) of U.S. Provisional Patent Application Ser. No. 63/056,531, filed on Jul. 24, 2020, and entitled "TRACKING STATE OF CHARGE OF LITHIUM THIONYL CHLORIDE BATTERY USING IMPEDANCE SPECTROSCOPY," which is hereby incorporated by reference herein in its entirety.

FIELD OF THE DISCLOSURE

The present application relates to determining a state of charge of a battery.

BACKGROUND

A battery is sometimes characterized by its state of charge, which is one indicator of its anticipated service lifetime. Some batteries exhibit a stable voltage over their lifetimes, until the point when there is no more retained charge.

BRIEF SUMMARY

Sensors and methods for determining the state of charge of a battery are described. The state of charge is determined in some instances by applying a current perturbation having a frequency to the battery terminals, monitoring the response signal, and determining the phase of the response signal. The phase may be correlated to the state of charge of the battery, so that once the phase is determined, a determination of the state of charge of the battery may be made. In some situations, the phase may be used to determine the operating condition of a load connected to the battery. In some embodiments, the state of charge may be used to determine whether the battery is defective.

Some embodiments are directed to a method of determining a state of charge of a non-rechargeable battery. The method may comprise, applying a current perturbation having a set frequency to the battery, detecting a voltage response of the battery to the current perturbation, determining a complex impedance of the voltage response at the set frequency, and identifying, using a direct correlation between the complex impedance and state of charge of the battery, the state of charge of the battery.

Some embodiments are directed to a system for determining a state of charge of a non-rechargeable battery. The system may comprise a frequency generator configured to apply a current perturbation to the non-rechargeable battery at a frequency, an impedance probe configured to detect a voltage response of the non-rechargeable battery at the frequency, a processor, and a non-transitory computer-readable storage medium storing processor-executable instructions that, when executed by the processor, cause the processor to: control the frequency generator to apply a current perturbation having a set frequency to the non-rechargeable battery; control the impedance probe to detect a voltage response of the non-rechargeable battery to the current perturbation; determine a complex impedance of the voltage response at the set frequency; and identify, using a direct correlation between complex impedance and state of charge of the battery, the state of charge of the non-rechargeable battery.

Some embodiments are directed to a system for determining a state of charge of a non-rechargeable battery. The system may comprise, a processor configured to: receive information indicative of a complex impedance of a voltage response of the non-rechargeable battery to an applied current perturbation, and determining the state of charge from the information indicative of the complex impedance.

BRIEF DESCRIPTION OF DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

Figure 1:
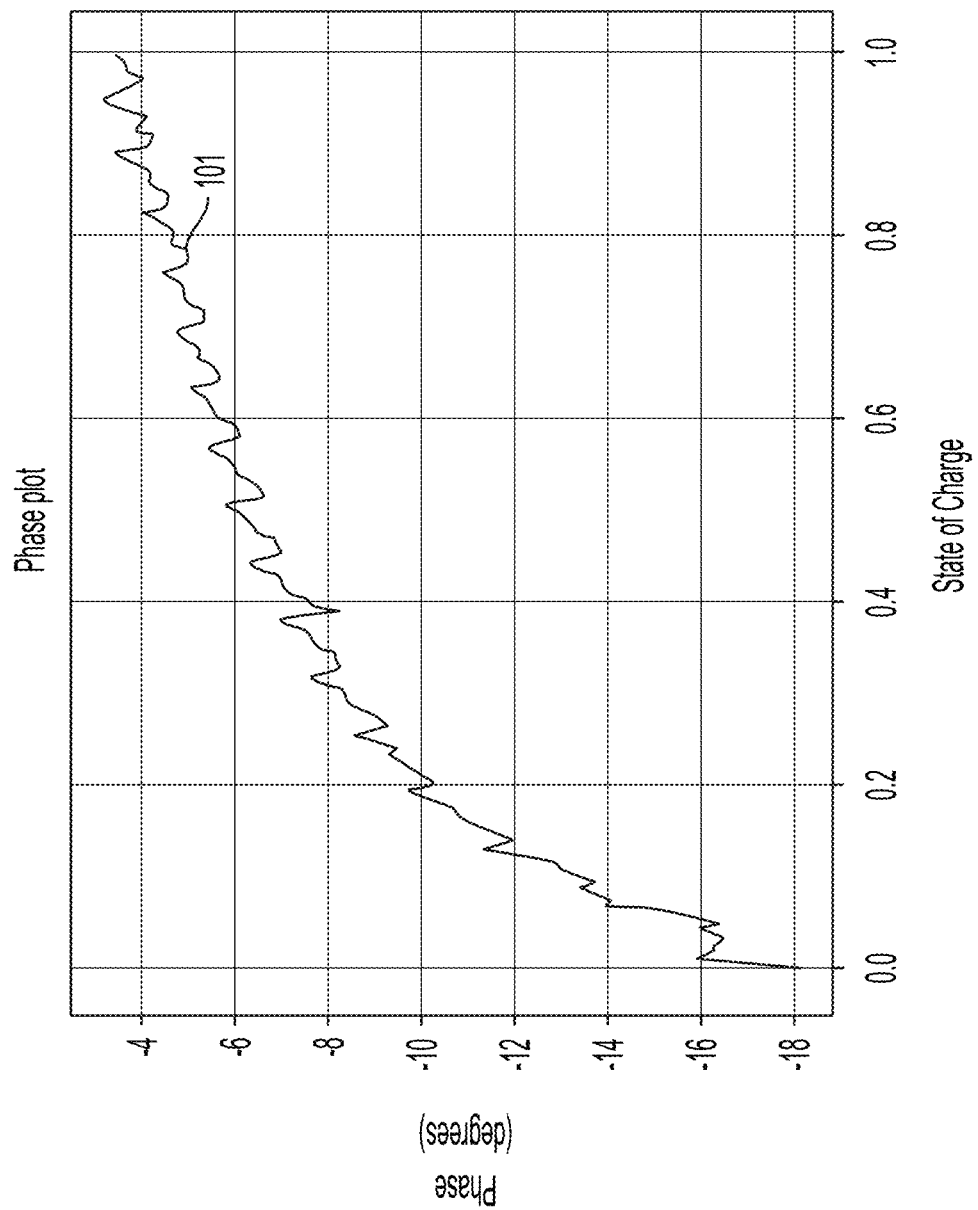
FIG. 1 illustrates a curve of the phase of the complex impedance of a voltage signal response to application of a current perturbation to the terminals of a lithium thionyl chloride battery as a function of the state of charge (SOC) of the battery, according to a non-limiting embodiment of the present application.

Aspects of the present application provide a method of determining the state of charge (SOC) of a lithium thionyl chloride battery by measuring the complex impedance of a signal generated by the battery in response to application of a current perturbation to the battery terminals. Lithium thionyl chloride batteries are sometimes used as non-rechargeable batteries due to their ability to exhibit relatively long lifetimes. Lithium thionyl chloride batteries may be characterized by high energy density (~1200 Wh/L in some embodiments), high specific energy (500 Wh/kg in some embodiments), stable voltage profile (~3.5 V in some embodiments), wide operable temperature range (−60° C. to 85° C. in some embodiments) and long shelf life (e.g., 10 years in some embodiments). The inventors have discovered and appreciated that lithium thionyl chloride batteries exhibit a correlation between SOC and the complex impedance of a response signal arising from application of a current perturbation to the battery terminals. Thus, aspects of the present application provide a method comprising applying a single frequency current perturbation—which may be a current pulse—to the battery terminals, monitoring the resulting voltage across the battery terminals, and determining the complex impedance of the voltage response. The SOC of the battery is then determined from the complex impedance of the voltage response, for example by referencing the correlation between SOC and phase of the complex impedance of the response signal. As another example, the SOC of the battery may also be determined using the imaginary component of the complex impedance of the response signal.

According to an aspect of the present application, a sensor is provided to determine the state of charge of a battery. The sensor is configured to apply a single frequency current perturbation—which may be a current pulse—to the terminals of the battery and monitor the response signal to determine the complex impedance of the response signal. The response signal may be a voltage signal. From the determined complex impedance of the response signal, and the temperature of the battery at the time of test, the sensor may determine the SOC of the battery. For example, a known correlation between the SOC of the battery and the phase of the response signal may be referenced. The sensor may additionally be used to assess the operating condition of the load and/or whether the battery is defective or not. In some embodiments, the sensor may include or may be a general purpose processor configured to execute instructions which cause the sensor to perform the method described above for determining the SOC of a battery.

According to an aspect of the present application, a battery and sensor are coupled together as a single unit and the sensor is configured to perform a method of determining the SOC of the battery. For example, the battery and the sensor may both be located within the same housing, such as within the housing of a utility meter. In some embodiments, the sensor may be configured as a component of the utility meter and the battery may be installed in the utility meter to provide power. In other embodiments, the sensor may be a separate component from the utility meter which is configured to provide power to the utility meter when a battery is coupled to the sensor. In yet other embodiments, the sensor may be separate from the utility meter and configured to interface with the utility meter to measure the SOC of a battery installed within the utility meter. The battery is a lithium thionyl chloride battery in at least some embodiments. The sensor is configured to apply a single frequency current perturbation—which may be a current pulse—to the terminals of the battery and monitor the response signal to determine the phase of the response signal. The response signal may be a voltage signal. From the determined phase of the response signal the sensor may determine the state of charge of the battery. For example, a known correlation between the SOC of the battery and the phase of the response signal may be referenced. In some embodiments, the sensor consults a look-up table to determine the SOC of the battery based on the measured phase of the response signal.

The complex impedance is a measure of the resistance and reactance of a circuit and is described in polar form by:

$$Z = |Z|e^{j\theta}$$

where |Z| represents the magnitude of the ratio between the amplitudes of the voltage and the current, j represents the imaginary unit, and θ represents the phase difference between the voltage and the current. The complex impedance can also be represented in Cartesian form by:

$$Z = R + jX$$

where R is the real component of the complex impedance (resistance), and X is the imaginary component of the complex impedance (reactance). Thus, four parameters are relevant to the complex impedance—magnitude, phase, the real component, and the imaginary component—and may be measured in response to applying a current perturbation to a circuit and detecting the voltage response.

As described above, the inventors have discovered and appreciated that lithium thionyl chloride batteries exhibit a correlation between SOC and the phase of a response signal arising from application of a current perturbation to the battery terminals. FIG. 1 illustrates a curve of the phase of the complex impedance of a voltage signal response to application of a current perturbation to the terminals of a lithium thionyl chloride battery as a function of the state of charge (SOC) of the battery. The plot was generated using a lithium thionyl chloride battery, AA size cylindrical cell with a nominal voltage of 3.6 V and a capacity of 2600 mAh (Saft batteries: LS 14500). A sinusoidal excitation with a frequency of 5 Hz and an AC amplitude of 12 mA was used for the impedance measurement. The direct correlation between SOC and the phase response at a frequency of 5 Hz is shown as Curve 101. As is evident from the figure, the correlation is monotonic, thus allowing for a simple one-to-one relationship between SOC and the measured phase response.

Figure 2:
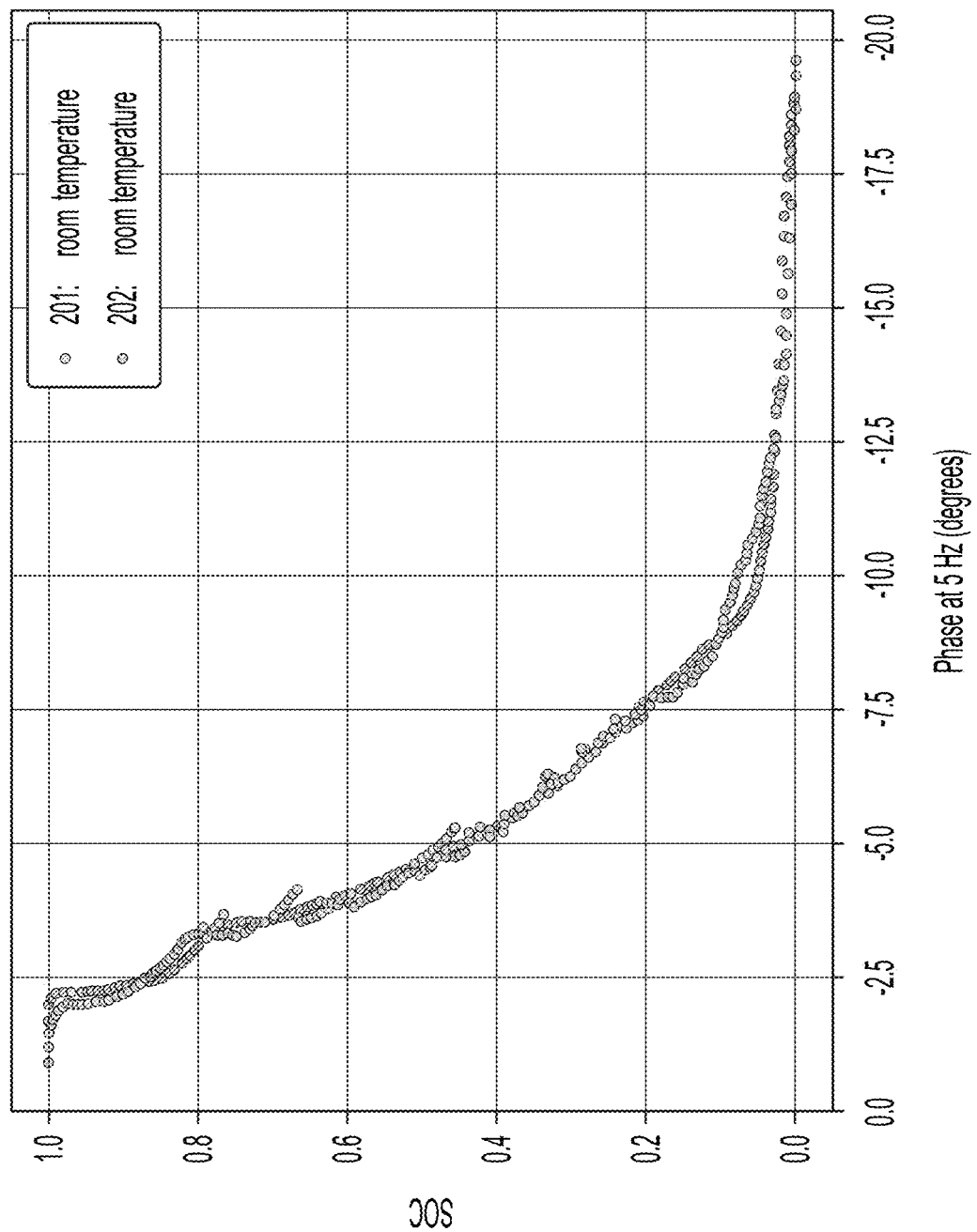
FIG. 2 illustrates the relationship between the phase of the complex impedance and the state of charge for multiple batteries at the same temperature, according to a non-limiting embodiment of the present application.

FIG. 2 illustrates experimental data of the relationship between the phase of the complex impedance and the state of charge for multiple batteries at the same temperature. Curve 201 corresponds to a first lithium thionyl chloride battery and curve 202 corresponds to a second lithium thionyl chloride battery. Both the first and second batteries were AA size cylindrical cells with a nominal voltage of 3.6 V and a capacity of 2600 mAh. The batteries were kept at approximately 26 degrees Celsius and discharged at a constant current of 5 mA from an initial voltage of 3.7 V to a final voltage of 3.0 V. Phase measurements to monitor the state of charge were taken once an hour using a sinusoidal excitation with a frequency of 5 Hz and an AC peak-to-peak amplitude of 12 mA was used for the impedance measurement. In FIG. 2, the SOC is defined to be 1 when the battery is new and 0 when the terminal voltage has reached 3V. As shown by the overlap of curve 201 and 202, the relationship between the phase of a voltage signal response to application of a current perturbation and the state of charge is monotonic and reproducible for lithium thionyl chloride batteries of the same size.

Figure 3:
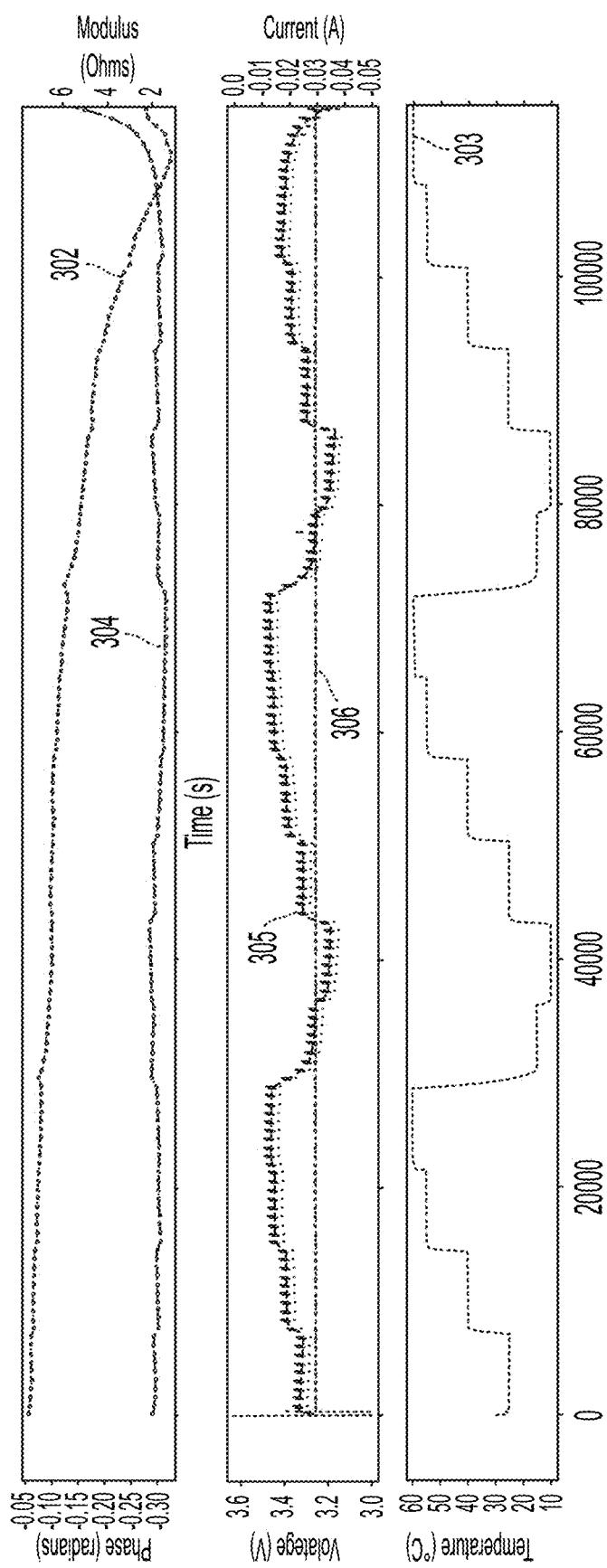
FIG. 3 is a plot of the complex impedance as a function of time, according to a non-limiting embodiment of the present application.

Furthermore, the inventors have discovered and appreciated that the correlation between SOC and the phase of the response signal of lithium thionyl chloride batteries is independent of the temperature history of the battery. That means that the SOC of a lithium thionyl chloride battery may be determined by applying a current perturbation to the battery terminals and measuring the phase of the response signal with knowledge of the present temperature of the battery, irrespective of the battery's temperature history. Such a method may therefore be performed under various environmental conditions, without the need to monitor the temperature during the operation of the battery, which may entail the use of power consuming equipment or testing procedures. FIG. 3 is a plot of a phase of the complex impedance as a function of time, according to a non-limiting embodiment of the present application. The curve 302 illustrates the phase of the complex impedance at a frequency of 5 Hz measured during the time of operation for a lithium thionyl chloride battery. Curve 302 demonstrates a clear correlation between the SOC and the phase of the response signal. This correlation can be used to determine the SOC for the battery. Furthermore, Curve 303 illustrates the temperature of the battery during the lifetime of operation. Curve 304 illustrates the modulus of the complex impedance at a frequency of 5 Hz during the time of operation for a lithium thionyl chloride battery. Curve 305 illustrates the measured voltage output during the time of operation for a lithium thionyl chloride battery. Curve 306 illustrates the discharge current applied to the battery during the time of operation for a lithium thionyl chloride battery. As evidenced by these graphs, there is no significant correlation between Curves 302 and 303, meaning that the phase response at the frequency of measurement is independent of temperature history. This independence from temperature history allows for a simple, robust correlation to be drawn between the phase response at a single frequency and the SOC knowing simply the single temperature of the battery at the time of test, without the measurement of additional parameters.

Although FIG. 3 illustrates experimental data associated with application of a 5 Hz signal, in some embodiments other frequencies may be used. For example, a Hz signal may be applied instead. The particular frequency or range of frequencies at which the battery exhibits a temperature-history independent correlation between the phase response and the SOC may depend on the battery size. For example, a battery of a first size may be characterized by a first frequency demonstrating a correlation between the phase response and the SOC, while a battery of a second size may be characterized by a second frequency demonstrating a correlation between the phase response and the SOC. In some embodiments, the frequency suitable for testing a battery of a particular size may be known, such that a sensor operating to determine the state of charge may be programmed to apply the known frequency.

Figure 4:
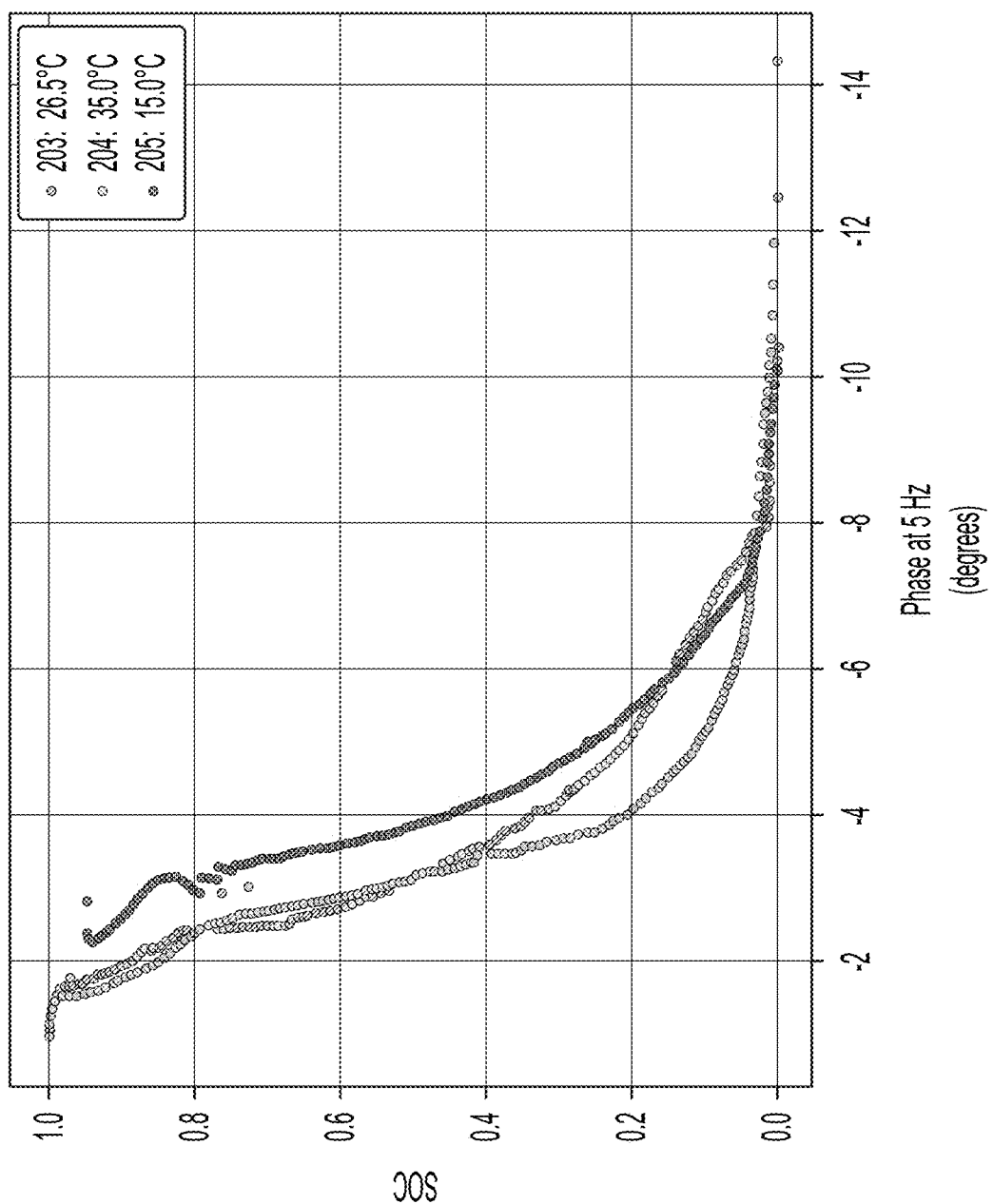
FIG. 4 illustrates the relationship between the phase of the complex impedance and the state of charge for multiple batteries at different temperatures, according to some non-limiting embodiments of the present application.

FIG. 4 illustrates experimental data of the relationship between the phase of the complex impedance and the state of charge for multiple batteries at different temperatures. Curve 203 corresponds to a first lithium thionyl chloride battery at 26.5 degrees Celsius; curve 204 corresponds to a second lithium thionyl chloride battery at 35 degrees Celsius; and curve 205 corresponds to a third lithium thionyl chloride battery at degrees Celsius. The three batteries were discharged in separate temperature-controlled chambers at a constant current of 5 mA until the terminal voltages reached 3 V. The impedance measurements for curves 203, 204, and 205 were taken once every hour. As shown in FIG. 4, at each temperature, the relationship between the state of charge and the phase of the voltage signal response to application of a current perturbation is monotonic.

Figure 5:
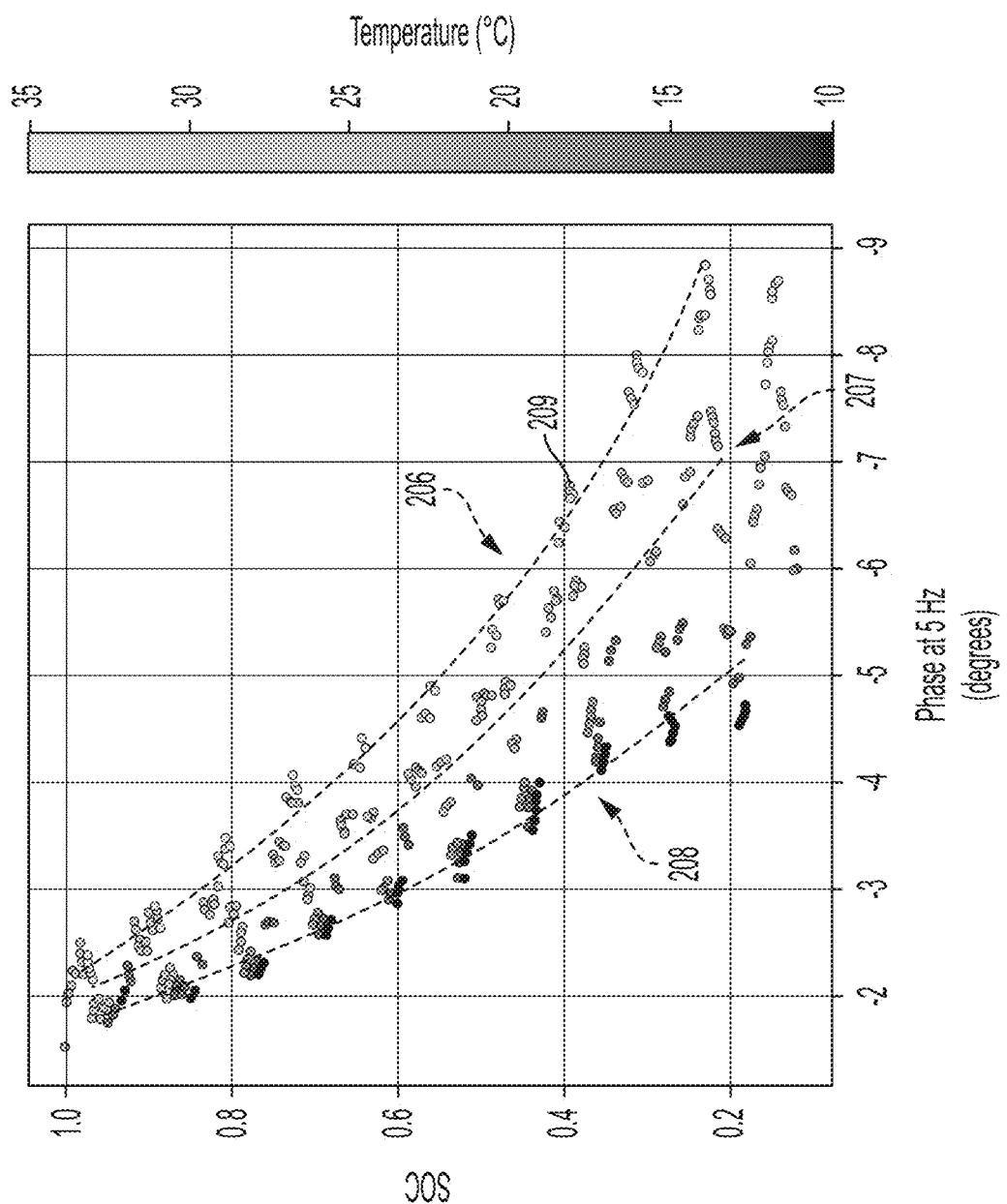
FIG. 5 illustrates the relationship between the phase of the complex impedance and the state of charge for a battery at different temperatures, according to some non-limiting embodiments of the present application.

FIG. 5 illustrates experimental data of the relationship between the phase of the complex impedance and the state of charge for a battery at different temperatures, as well as curve fits for the experimental data. A lithium thionyl chloride battery was discharged in a temperature-controlled chamber at a constant current of 5 mA until the terminal voltage reached 3V. While discharging, the temperature of the chamber was changed randomly between 10° C. and 35° C. As shown by the curves 206, 207, and 208 in FIG. 5, the measurements of the phase signal response at a given temperature are monotonic. Curve 206 represents the monotonic relationship at 35 degrees Celsius between the phase of the complex impedance and the SOC; curve 207 represents the monotonic relationship at 25 degrees Celsius between the phase of the complex impedance and the SOC; and 208 represents the monotonic relationship at 10 degrees Celsius between the phase of the complex impedance and the SOC. Therefore, the SOC can be determined from the phase of the complex impedance and the temperature at the time of measurement. For example, despite the varying temperatures and varying number of measurements between the measurements taken at 35 degrees Celsius, the phase measurements still follow the relationship illustrated by curve 206. The same is true of the measurements at other temperatures. Therefore, in some embodiments, a single phase-measurement and the temperature at the time of measurement may be used to determine the SOC. For example, as shown in FIG. 4, measuring the phase of a complex impedance measurement 209 of −6.5 degrees at a temperature of 35 degrees Celsius corresponds to a SOC of approximately 0.4, indicating that 60% of the battery capacity has been depleted.

In some embodiments, the remaining life of the battery may be determined based on a predicted and/or calculated power requirement and the SOC. For example, for a non-rechargeable battery with a capacity of 2600 mAh and an SOC of 0.5, the remaining capacity would be 1300 mAh. Using a predicated power requirement, that may be provided as an input, such as average power input per day of 13 mA. The remaining life of the battery would be estimated to be 100 days. As another example, for a non-rechargeable battery with a capacity of 2600 mAh and a SOC of 0.1, the remaining capacity would be 260 mAh. A calculated power requirement can be determined from the time in service and the SOC. If the SOC of 0.1 was measured after 9 years of operation, an average power requirement may be calculated to be 260 mA/year and the remaining life of the battery may be estimated to be 1 year.

Figure 6:
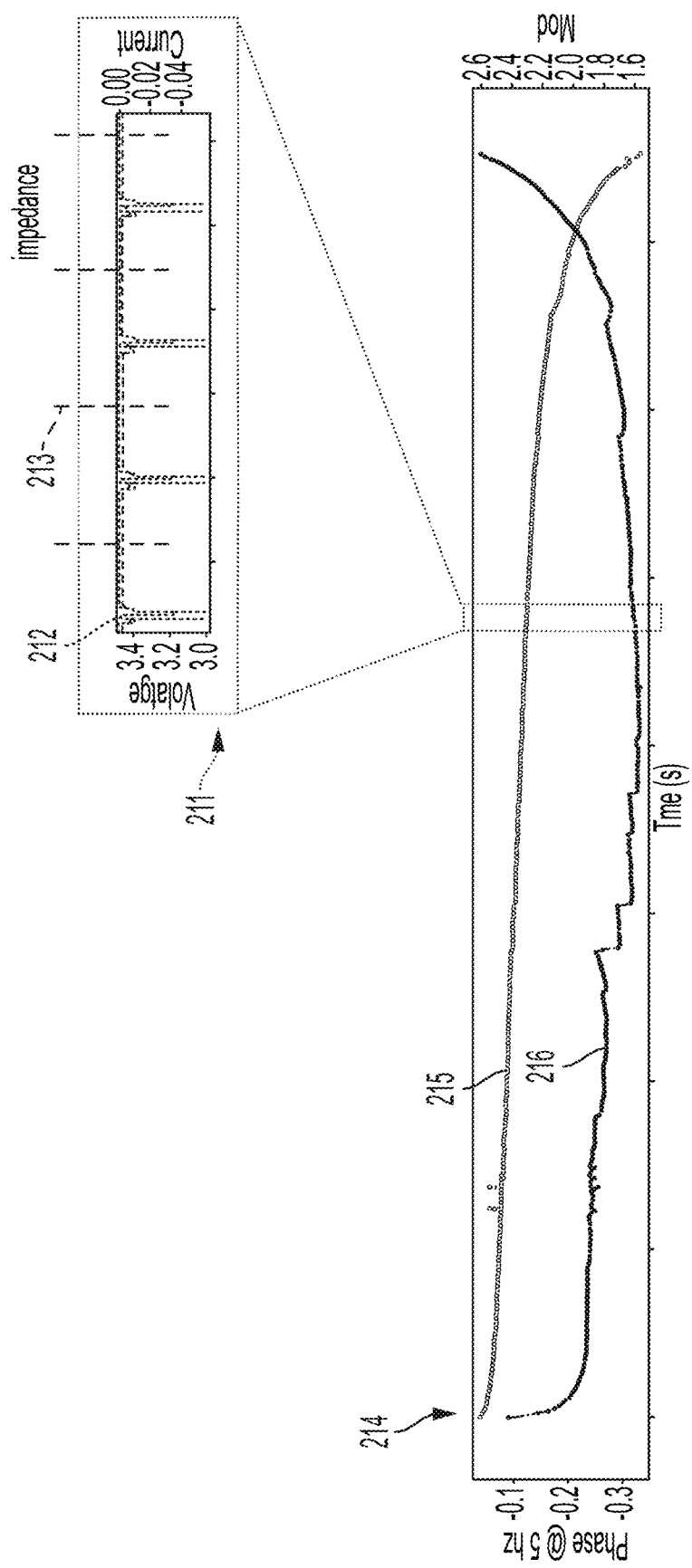
FIG. 6 illustrates the evolution of the phase and modulus of a voltage signal response to application of a current perturbation for a battery under a pulsed load, according to some embodiments of the present application.

FIG. 6 illustrates experimental data of the evolution of the phase and modulus of a voltage signal response to application of a current perturbation for a battery under a pulsed load. A lithium thionyl chloride battery was discharged with intermittent high loads by applying current spikes to the battery for several seconds and then relaxed with no load for 20 minutes. The complex impedance of the battery at 5 Hz was measured during the relaxed state and the cycles were repeated until the battery was fully discharged to 3V. The intermittent high loads replicated a use case, such as a utility meter or an internet-of-things (IoT) sensor that gets activated periodically but remains dormant otherwise. Top panel 211 shows an enlarged portion of bottom panel 214 illustrating the timing of impedance measurements 213 overlaid with the voltage and current within the same time window. The intermittent high load corresponds to the pulsed voltage spikes 212. The bottom panel 214 illustrates the phase 215 and modulus 216 of the complex impedance as a function of discharge time. As illustrated by panels 211 and 214, despite the varying loads on the battery, the phase of the complex impedance has a monotonic decay over the discharge time. Therefore, the phase of the impedance can be used as a reliable indicator of SOC.

Figure 7:
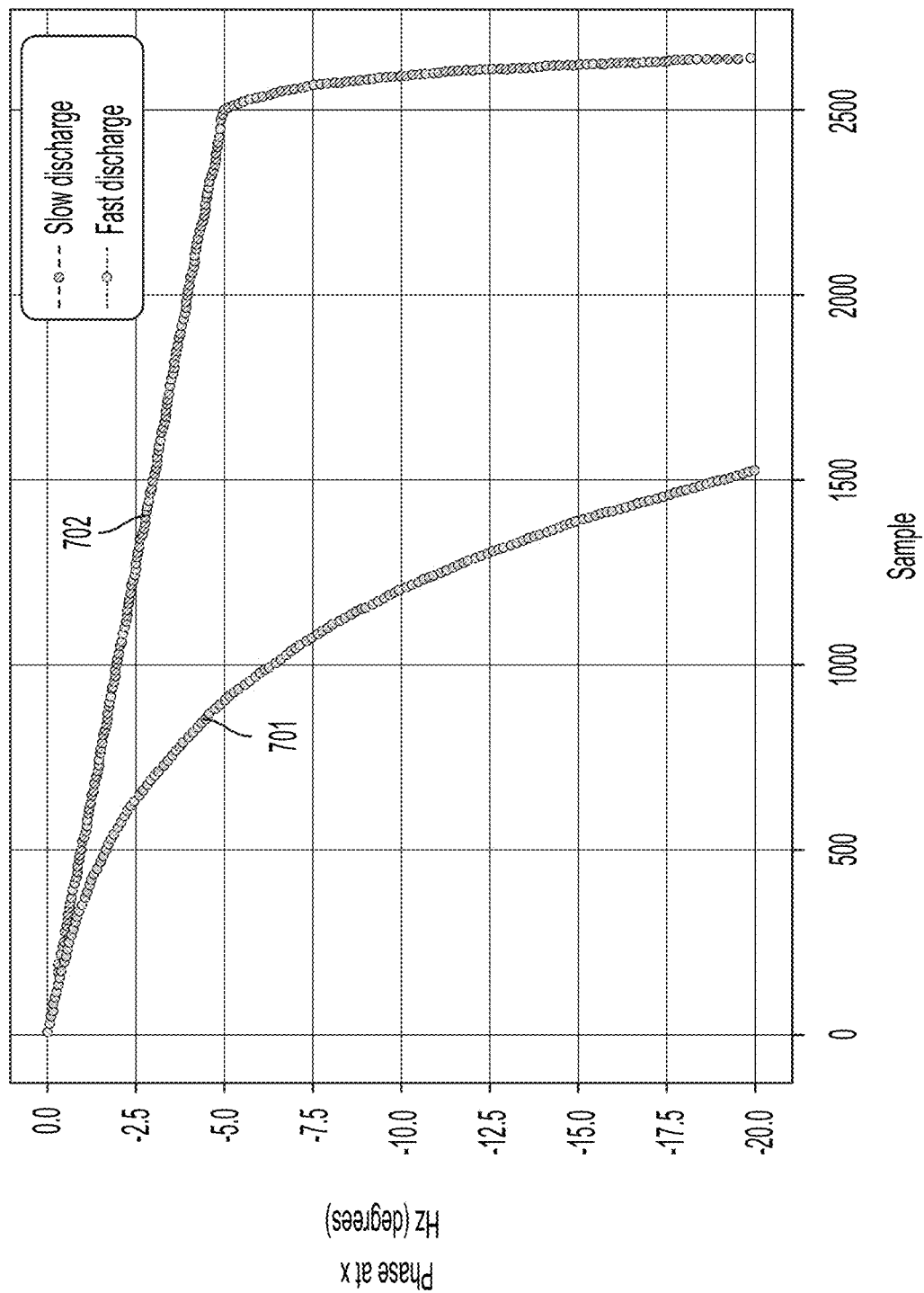
FIG. 7 illustrates simulated phase response curves for two different load conditions of a battery, according to a non-limiting embodiment of the present application.

The inventors have also discovered and appreciated that this phase response differs by load condition, effectively bifurcating the phase response into two separate curves. That means that by monitoring the evolution of the phase response over time, the load condition of a lithium thionyl chloride battery may be determined. Such a method may therefore be performed using the instantaneous temperature at the time of measurement. FIG. 7 illustrates simulated data of phase response curves for two different load conditions of a battery, according to a non-limiting embodiment of the present application. The figure shows the simulated phase response during the lifetime of operation for two batteries configured with different discharge rates and measured at the same frequency (x Hz). In a normal load regime, the battery will discharge slowly, however in an overloaded regime that battery will discharge at an accelerated rate. The two different phase response curves correspond to the simulated phase for slow discharge rate 702 and fast discharge rate 701. The discharge rate not only changes the operational lifetime of the battery but also how the phase response evolves over time. Comparing curves 701 and 702 illustrates that the phase response follows a different polynomial curve, as determined by its load. Thus, there is a strong correlation between the evolution of the phase response and the battery load. The simulated curves corresponding to discrete relationships between the phase and the load condition are confirmed by the experimental data in FIG. 8.

Figure 8:
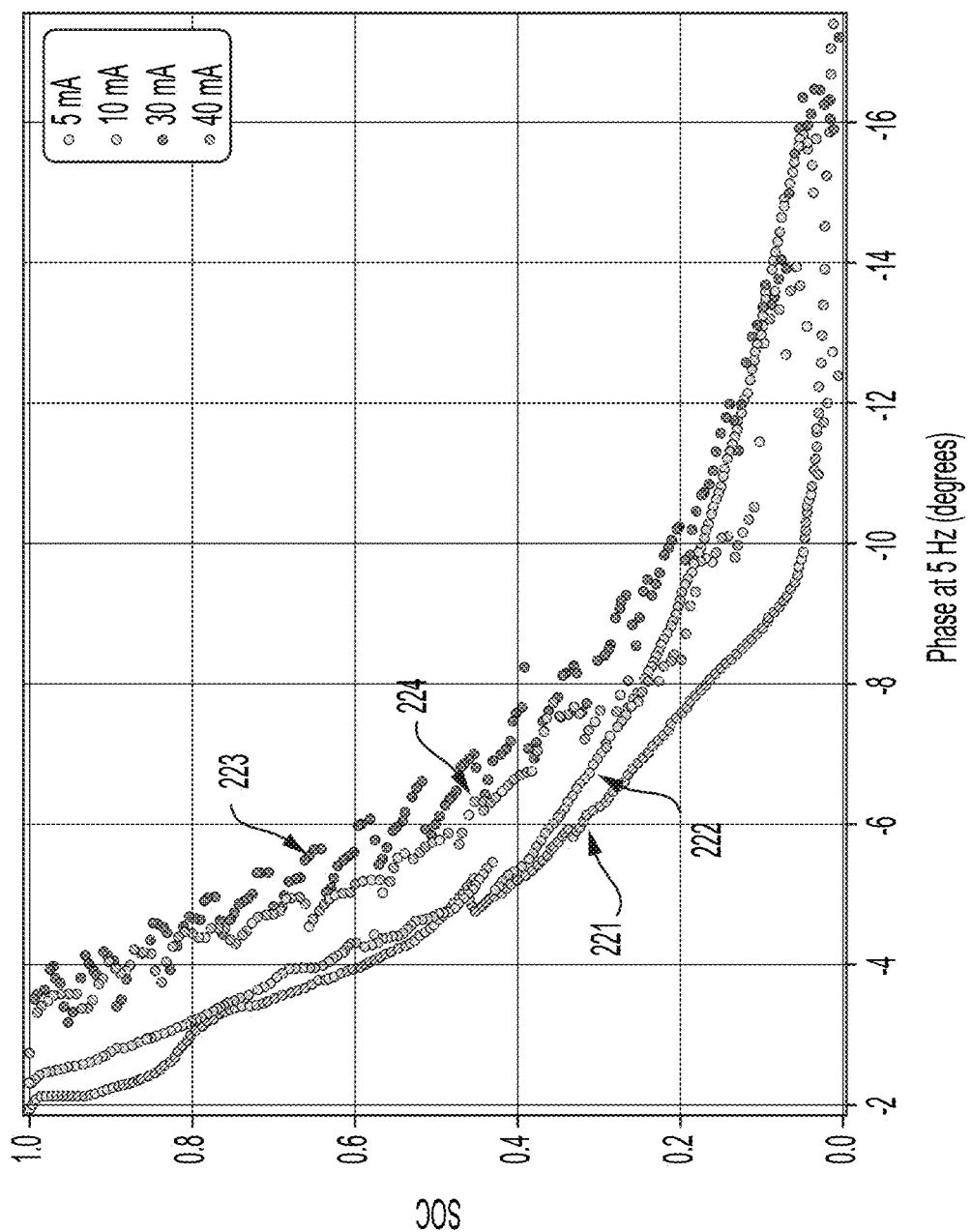
FIG. 8 illustrates the relationship between the phase of the complex impedance to the load on the battery, according to a non-limiting embodiment of the present application.

FIG. 8 illustrates experimental data of the relationship between the phase of the complex impedance to the load on the battery. Four lithium thionyl chloride batteries were each discharged at a different load current until the terminal voltage reached 3V. The discharge load currents were kept constant for each battery during discharge and complex impedance measurements at 5 Hz were taken once an hour in a temperature-controlled chamber at approximately 26 degrees Celsius. Curve 221 corresponds to a first battery discharged at a constant current of 5 mA; curve 222 corresponds to a second battery discharged at a constant current of 10 mA; curve 223 corresponds to a third battery discharged at a constant current of 30 mA; and curve 224 corresponds to a fourth battery discharged at a constant current of 40 mA. As shown in FIG. 8, the correlation between the phase of the complex impedance and the SOC can be split into two bands. Batteries discharged with load currents less than 9 mA follow a first trend, curve 221, while batteries with loads greater than 10 mA follow a second trend, curves 223 and 224. Loads that are approximately equal to 10 mA, curve 222, initially follow the first trend but deviate to the second band at approximately 50% SOC.

In some embodiments, the load condition of the battery is determined using measurements of the phase of the complex impedance. Additionally, by measuring the phase of the complex impedance at several times during the discharge of the battery, a change in the load condition of the battery can be determined by a shift in the phase of the complex impedance from one trend to the other. Such a shift in load condition may be associated with equipment malfunction. Therefore, in some embodiments, the phase of the complex impedance may be used to determine an equipment malfunction. For example, current levels of less than or equal to 5 mA may be considered typical usage of a battery. If a utility meter, powered by the battery, is tampered with and/or damaged, such that it draws higher currents from the battery, the shift from curve 221 to curve 222, 223, or 224 could be detected.

FIGS. 1-8 above illustrate the evolution of the complex impedance throughout the lifetime of lithium thionyl chloride batteries. Accordingly, the discovered relationships illustrated, and discussed, above may be used in methods and sensor/systems, as described herein, for determining the SOC, load condition, and early failure detection for a lithium thionyl chloride battery based on the complex impedance.

Determining SOC

According to an aspect of the present application, the state of charge of a lithium thionyl chloride battery is determined by applying a single frequency current perturbation to the battery and measuring the resulting phase response, at a known temperature. For example, the phase response is correlated with the state of charge and independent of temperature history of the battery. Thus, the phase response can be utilized as a precise one-to-one measure of the state of charge.

The inventors have recognized that monitoring a battery using complex impedance measurements provides challenges, because the complex impedance may be influenced by many factors. In some batteries, such as lead acid battery and lithium ion batteries, the operating history of the battery will impact complex impedance measurements of the battery. For example, during operation, the temperature and battery load may change the development of chemical and/or physical changes within the battery. Chemical and/or physical changes in the battery may impact the complex impedance measured from the battery. Therefore, the accuracy of a condition of the battery (e.g., state of charge), is proportional to the accuracy of the recorded history of the battery. For example, a monitor that is constantly recording the operating history (e.g., temperature and load of the battery) may provide a more accurate condition of the battery than a monitor that records less frequent operation history. However, more frequent measures of the operating temperature and/or load of the battery may increase the power used to monitor the battery.

Different parameters of the complex impedance may respond differently to chemical and/or physical changes in the battery. Additionally, the complex impedance measured at different frequencies may be impacted differently by chemical and/or physical changes. Therefore, using multiple frequency measurements may provide insights into the changes that have occurred within the battery. However, using multiple frequencies increases the power used for measuring the complex impedance. Measuring the operating temperature and battery load over the lifetime of the battery can similarly provide insights into the changes that have occurred within the battery. However, measuring the temperature and load condition over the lifetime of the battery may consume excess power and storage. Additionally, it is not always possible to know the operating history of a battery.

Recognizing the above challenges of using the complex impedance to monitor the condition of a battery, the inventors have developed techniques that use the phase of the complex impedance and the temperature at the time of measurement to determine SOC. In some embodiments, the complex impedance is measured at a single frequency, where the complex impedance is independent of the historic operating conditions of the battery, and uses a temperature at the time of measurement to determine SOC. The inventors have further recognized that the frequency used to measure the complex impedance may impact the accuracy and/or power consumption of the measurement. The inventors have appreciated that while some low frequencies (e.g., less than 1 Hz) may be used to determine SOC, frequencies greater than 1 Hz may provide more accurate measurements, as the time of acquisition is shorter and by extension, less susceptible to fluctuations of the environmental conditions for which the measurement is performed. Additionally, the lower the measurement frequency, the more power will be consumed from the battery. For example, if a frequency of 10 mHz was used, the measurement would take at least 10 seconds, drawing power from the battery at least for the duration of the measurement. Similarly, at high frequencies (e.g., kilohertz frequencies or higher) the AC contribution to impedance may dominate over the DC contribution. The inventors have recognized that frequencies for which the measured impedance is dominated by the DC contribution may be advantageous for providing more accurate measurements and may additionally enable more energy efficient hardware for generating the frequency perturbation and/or detecting the phase of the impedance response.

Figure 9:
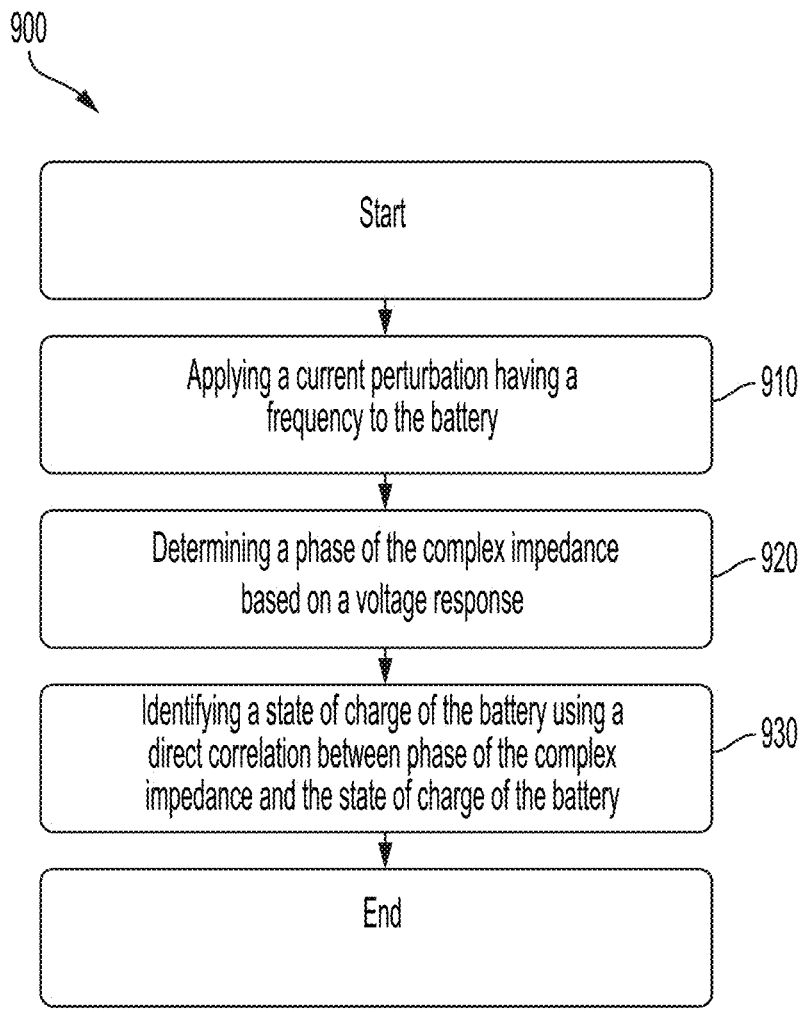
FIG. 9 illustrates a method for determining the SOC of a lithium thionyl chloride battery, according to a non-limiting embodiment of the present application.

FIG. 9 illustrates a method 900 for determining the SOC of a lithium thionyl chloride battery, in accordance with some embodiments. Prior to the start of method 900 a temperature of the battery may be detected by a temperature sensor. The temperature sensor may be configured to measure the temperature of the battery during method 900. The temperature sensor may be configured to measure an ambient temperature of the load device, in addition to or as an alternate to measuring the temperature of the battery directly. Additionally, or alternatively, the temperature sensor may be configured to measure the temperature of the battery independently of method 900 and may store the results in memory. In some embodiments, method 900 may be initiated in response to detecting a temperature within a temperature range of interest and in accordance with a measurement interval (e.g., hours, days, months, or years). For example, a temperature range of interest may be −60° C. to 86° C. in some embodiments, or 15° C. to 27° C. in other embodiments. Other temperature ranges of interest are possible as aspects of the technology described herein are not limited in this respect.

In some embodiments, prior to the start of method 900, a measurement frequency at which the complex impedance will be measured may be selected based on a target accuracy and a target power consumption. For example, a higher frequency may be selected to reduce power consumption, while a lower frequency may be selected to increase accuracy. In some embodiments, more than a single frequency may be used, at the expense of consuming additional power to provide a more accurate measurement.

Method 900 starts at stage 910 by applying a current perturbation, having a single frequency, to the battery. The battery may be an AA size cylindrical battery. For example, the battery may be a lithium thionyl chloride battery with a 3.6 V nominal voltage and a capacity of 2600 mAh. Other battery chemistries and/or other battery sizes may also be used, as aspects of the technology described herein are not limited in this respect.

As discussed above, the inventors have discovered that, for lithium thionyl chloride batteries, a frequency in the range of 1 to 100 Hz may be used to determine the state of charge of the battery. For example, a sinusoidal current perturbation with a frequency of 5 Hz may be applied to the battery terminals, in accordance with some embodiments. As another example, a sinusoidal current perturbation with a frequency of 40 Hz may be applied to the battery terminals, in accordance with some embodiments.

Next at stage 920, a phase of a complex impedance response of the battery to the applied current perturbation is determined. Impedance is a complex value that includes the resistance and reactance of an electronic circuit. The magnitude of the impedance represents the ratio of the voltage amplitude to the applied current amplitude and the phase represents the phase shift between the measured voltage signal relative to the applied current perturbation signal. The phase of the impedance can be detected using a suitable sensor and processor. For example, the sensor may detect a complex impedance by detecting the voltage response of the battery to the current perturbation and the phase of the voltage response may be determined by a processor that receives a signal indicative of the phase of the voltage response.

Next at stage 930, a SOC of the battery is determined. For example, the SOC may be determined by using a look up table to identify the SOC that corresponds to the measured phase of the complex impedance based on the voltage response, in accordance with some embodiments. Additionally, or alternatively, the look up table may identify the SOC based on the measured phase of the complex impedance based on the voltage response in combination with an instantaneous temperature associated with the measured voltage response. The temperature associated with the measured voltage may be a temperature measured before method 900 is initiated and stored in memory or a temperature measured during method 900 and may include temperature measurements of the battery itself and/or ambient temperature measurements.

Additionally, or alternatively, an equation empirically determined based on the relationship between the SOC and the measured voltage response may be used to determine the SOC. In some embodiments, the equation may include a correction factor to adjust for the temperature associated with the measured voltage. Additionally, or alternatively, an equation that corresponds to an instantaneous temperature, or range of temperatures, associated with the measured voltage response may be used to determine the SOC.

Method 900 ends when a SOC is determined. Following the conclusion of method 900, the phase of the phase response and/or the determined SOC may be stored in memory to monitor the change of SOC over time. The phase response may additionally be used in connection with methods 1300 and 1400, as described in further detail below in connection with FIGS. 13 and 14.

Method 900 may start again, after an interval of time has elapsed, from stage 910 to determine a later SOC of the battery. Repeated measurements of the SOC may be used to monitor the rate of energy consumption of the device and/or predict a time that the battery may need to be replaced. The interval of measurement may be based on a user input or may be determined by the time of operation. In some embodiments, the SOC may be determined once every 2 years, once every year, or once every 6 months. In some embodiments, the SOC may be determined once every hour, day, or month. Other intervals of measurement for the SOC may also be used, as aspects of the technology described herein may not be limited in this respect.

Aspects of the present application provide a sensor which may be used in connection with the method described above in connection with FIG. 9. The sensor may be configured to determine SOC in accordance with method 900. The sensor may additionally include a temperature sensor to detect an instantaneous temperature of the battery or ambient temperature of the load device.

Figure 10:
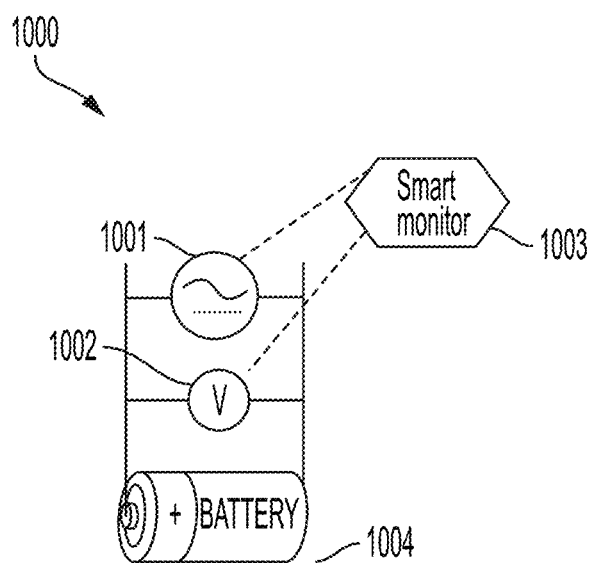
FIG. 10 illustrates a sensor coupled to a battery according to a non-limiting embodiment of the present application.

FIG. 10 illustrates a sensor coupled to a battery according to a non-limiting embodiment of the present application. Sensor 1000 is configured to determine the SOC of battery 1004. Sensor 1000 includes frequency generator 1001 and impedance probe 1002 and uses those components to measure the phase response of battery 1004. For example, the frequency generator 1001 may generate a current perturbation having a frequency to apply to the terminals of the battery 1004. For example, the frequency generator 1001 may generate a 5 Hz current pulse. Impedance probe 1002 is configured to monitor the phase response of the battery at the frequency applied by frequency generator 1001. Smart monitor 1003 controls frequency generator 1001 and reads the response of impedance probe 1002.

Additionally, or alternatively, sensor 1000 may be configured to determine the load on the battery load and/or provide advanced failure detection. In some embodiments, smart monitor 1003 may be configured to determine the load on the battery based on a phase response of the complex impedance. For example, sensor 1000 may be configured to implement aspects of load detection described below in connection with FIG. 13 such as method 1300. In some embodiments, sensor 1000 may be configured to provide advanced failure detection based on a phase response of the complex impedance. For example, sensor 1000 may be configured to implement aspects of advanced failure detection described below in connection with FIG. 14, such as method 1400. As a further example, sensor 1000 may be configured to implement methods 900, 1300, and/or 1400 based on complex impedance measurements of a battery, as described herein.

Figure 11:
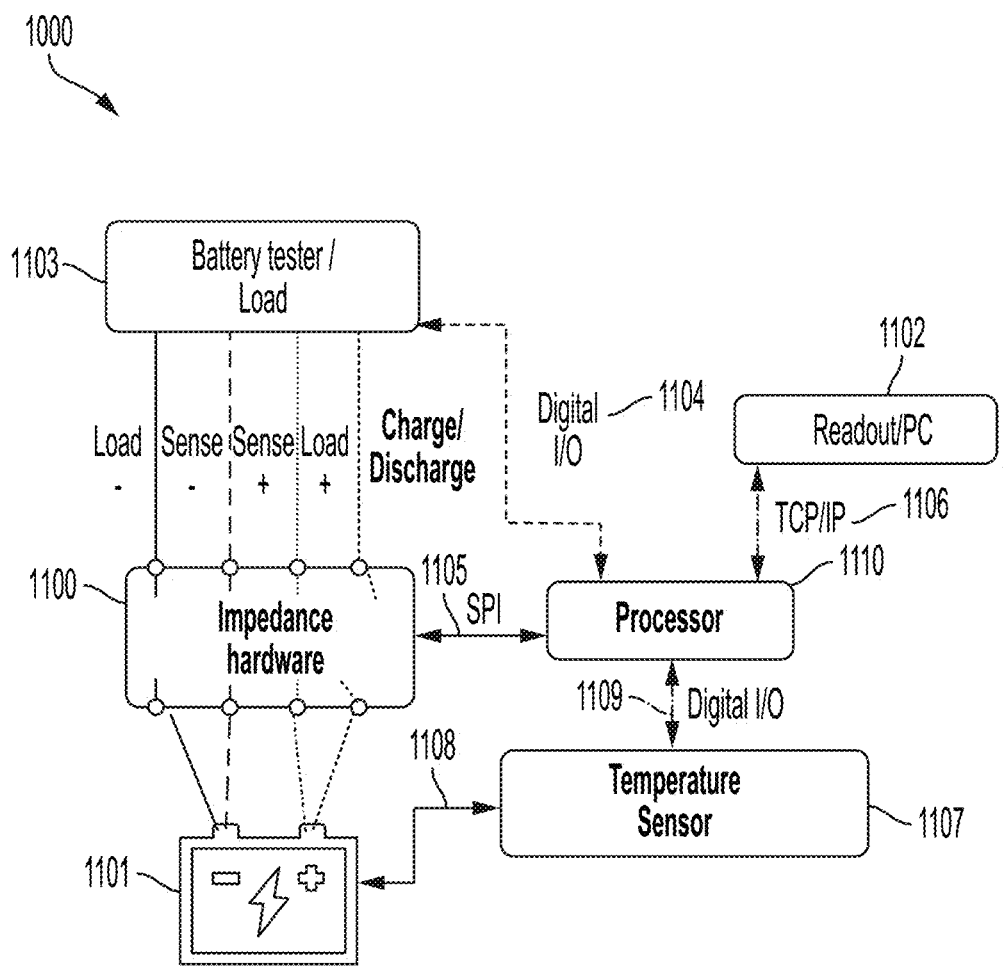
FIG. 11 illustrates a non-limiting example of an implementation of the sensor of FIG. 10, coupled to a battery, according to a non-limiting embodiment of the present application.

FIG. 11 illustrates a non-limiting example of an implementation of the sensor 1000 of FIG. 10, coupled to a battery 1101, according to a non-limiting embodiment of the present application. In the illustrated embodiment, sensor 1000 includes impedance hardware 1100, battery tester/load 1103, processor 1110, readout/PC 1102, and temperature sensor 1107. Impedance hardware 1100 may be configured with a 4/2 terminal connection or a load resister with 2 terminals. Processor 1110 is preloaded with firmware and software, including algorithms and application layers to determine SOC from the impedance hardware and interact with the readout/PC 1102. The impedance hardware may be powered from the battery itself or bypass it to use an external power source. In some embodiments, the impedance hardware 1100 may be an ADI AD5940 high precision, impedance, and electrochemical front end. In the illustrated embodiment, the battery tester or load device 1103 communicates with a processor 1110 via a digital I/O 1104 and the impedance hardware 1100 communicates to the processer 1110 via a serial peripheral interface (SPI) 1105. The processer communicates the result via a transmission control protocol/internet protocol (TCP/IP) port 1106 (or any other serial port) to a readout/PC 1102. Processor 1110 may include firmware, algorithms, and an application layer for implementing methods of determining SOC, load condition, and advanced fault detection, as described herein.

In some embodiments, battery tester/load 1103 is configured to provide power from the battery at a set voltage and/or current to a load. For example, when implemented in a utility meter, battery tester/load 1103 may sense an actual output voltage across the load leads and adjust an internal property of the battery tester/load 1103 (e.g., a resistance) such that the actual output voltage provided to the utility meter matches the set voltage. Additionally, or alternatively, battery tester/load 1103 may be configured to provide a simulated load to the battery so the battery may be tested at a set load.

In some embodiments, a temperature sensor 1107 is included with the battery hardware to measure a temperature of the battery. The temperature sensor 1107 may include a thermocouple 1108 for measuring a temperature of the battery. Temperature sensor 1107 communicates with a processor via a digital I/O 1109. In some embodiments, the temperature sensor is included with the impedance hardware 1100. In other embodiments, the temperature sensor may be separate from the impedance hardware 1100.

In some embodiments, battery 1101 is a single cell battery. For example, battery 1101 may be an AA size cylindrical cell lithium thionyl chloride battery with a nominal voltage of 3.6 V and a capacity of 2600 mAh. Battery 1101 may include other battery sizes and/or chemistries, as aspects of the technology described herein are not limited in this respect. In other embodiments, battery 1101 may be a multi-cell battery including multiple batteries configured to provide a common output.

Figure 12:
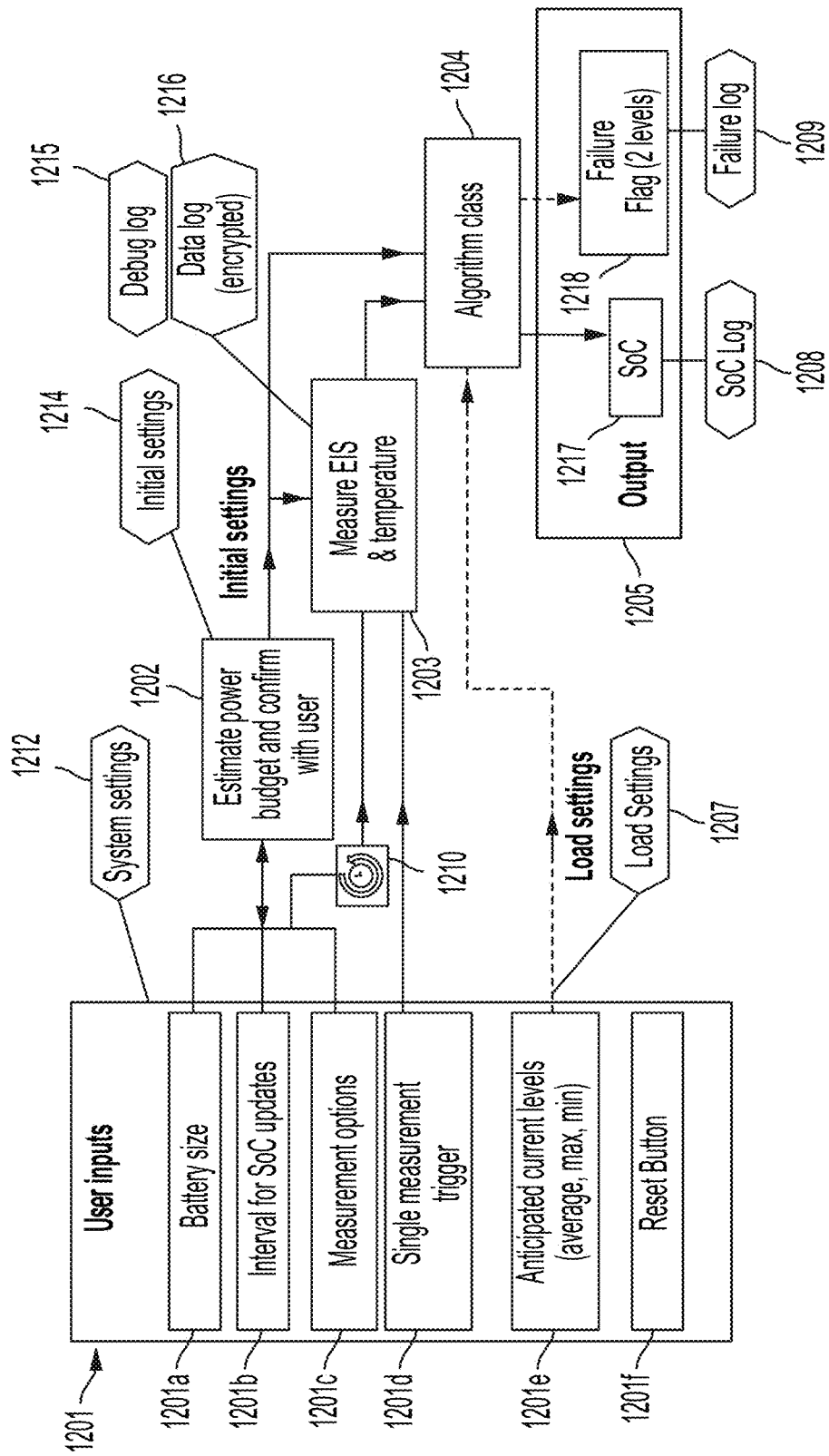
FIG. 12 is a software and firmware implementation of a sensor, according to a non-limiting embodiment of the present application.

FIG. 12 is a software and firmware implementation of a sensor, according to an embodiment of the present application. The software registers user inputs, determines SOC, and provides output feedback to the user. A user may provide the user inputs 1201, including battery size 1201*a*, interval for SOC 1201*b*, measurement options 1201*c*, single measurement trigger 1201*d*, anticipated current levels 1201*e*, and/or reset button 1201*f*. The battery size 1201*a* user input may include both the battery chemistry and cell size of battery for which the SoC is to be determined. For example, the battery may be a lithium thionyl chloride battery, cell type AA, C, or D. The measurement options 1201*c* user input may include a low accuracy mode that uses less than 0.05 mA of power per measurement, a high accuracy mode that uses between 0.05 mA and 0.5 mA for each measurement, and a multi-frequency mode that may measure the impedance at more than one discrete frequency or by using a frequency sweep.

Using the user inputs 1201, the system calculates the total power that the SOC estimation would require 1202. For example, the system may calculate the total power that the SOC estimation would require based on user inputs 1201a, 1201b, and 1201c. In some embodiments, following the calculation of the total power, the system sends a confirmation request to the user to check that the power budget is acceptable and that all hardware settings on the board are correct. The user settings and hardware settings are stored in initial settings 1214. In some embodiments, if the user input 1201c is set to the multi-frequency mode, the system may send a recommendation to the user to use an external power source due to the increased power consumption of multi-frequency measurements. If available, the user may than select an external power source to provide power for the measurement. Otherwise the user may continue to use power from the battery for the multi-frequency measurement, at the expense of additional power consumption.

If an interval for SOC 1201b is chosen, a measurement is automatically taken every interval. Internal clock 1210 may provide timing information, such as time stamps, for determining when to initiate a measurement 1203 in accordance with interval 1201b. If an interval is set to 0, then the system waits for the 'Single measurement trigger' 1201d to be enabled to take a measurement.

The EIS & temperature measurement 1203 measures a complex impedance of the battery in accordance with the initial settings 1214. The measurement may be initiated by a timing signal received from internal clock 1210 in accordance with an interval 1201b or by a user input single measurement trigger 1201d. In some embodiments, a temperature measurement of the battery is included with the measurement of the complex impedance of the battery. In other embodiments, the temperature measurement may occur prior to the complex impedance measurement to check if the temperature of the battery is within a desired temperature range for measuring the complex impedance. For example, the desired temperature range may be between 20° C. and 40° C. As another example, the desired temperature range may be between 20° C. and 30° C. As yet another example, the desired temperature range may be between 22° C. and 28° C. The measured complex impedance values may be stored in data log 1216 as encrypted data.

The measured complex impedance values are processed by algorithm class 1204 to produce output 1205 including a SOC 1217. Algorithm class 1204 receives the complex impedance and determines a corresponding SOC 1217, as described herein. The determined SOC 1217 is stored in SOC log 1208. Algorithm class 1204 may also receive initial settings 1214, load settings 1207, and/or temperature measurement which may be used to determine a SOC 1217 based on the complex impedance. In some embodiments, output 1205 also includes failure flag 1218. Algorithm class 1204 generates failure flag 1218 based on the load settings 1207 and the determined SOC 1217 to estimate the remaining life of the battery or an expected SOC based on previous SOC determinations. If the determined SOC 1217 does not match an expected SOC, then algorithm class 1204 may produce a failure flag 1218. The failure flag 1218 may be stored in failure log 1209 and may indicate that a change between the determined SOC 1217 and an expected SOC has been detected.

Load settings 1207 includes the stored user input anticipated current levels 1201e. Load settings may include the anticipated current such as the anticipated average operating current, anticipated maximum peak current, and the anticipated minimum rest current. In some embodiments, load settings may also include anticipated temperature values such as anticipated average operating temperature, anticipated maximum temperature, and anticipated minimum temperature. In some embodiments, the load settings may be updated based on the results on measured values for the load and/or temperature.

In some embodiments, errors may be stored in debug log 1215. For example, tracing errors regarding code flow, board status, register values, or communication errors between ports may be stored in debug log 1215.

If the battery is replaced, then the user will press the reset button 1201f to clear settings and restart a new measurement or set of measurements. In some embodiments, user input from the reset button 1201f may clear SOC log 1208, failure log 1209 while the debug log 1215 and data log 1216 may indicate that a reset has occurred but will retain the existing log information. In other embodiments, all the logs may be cleared in response to user input from the reset button 1210f. In yet other embodiments, logs may be transferred to an archive and new logs may be initialized in response to user input from the reset button 1201f.

Determining Load Condition

According to some embodiments, the load condition for a battery can be determined by the phase response. The phase response of a battery to an applied single frequency current perturbation may be used to determine if the load of operation for said battery is either within the range of normal operation or exceeding the range of normal operation. By measuring the phase response of a battery to an applied single frequency current perturbation over time. The recorded phase response will show how the phase response is evolving. Under normal load, this evolution of phase follows a first trendline, however when the load on the battery exceeds the normal load, the evolution of phase follows a second trendline. Therefore, by monitoring the evolution of the phase response of a battery, it is possible to determine if that battery has been operating under normal load or an above normal load.

Figure 13:
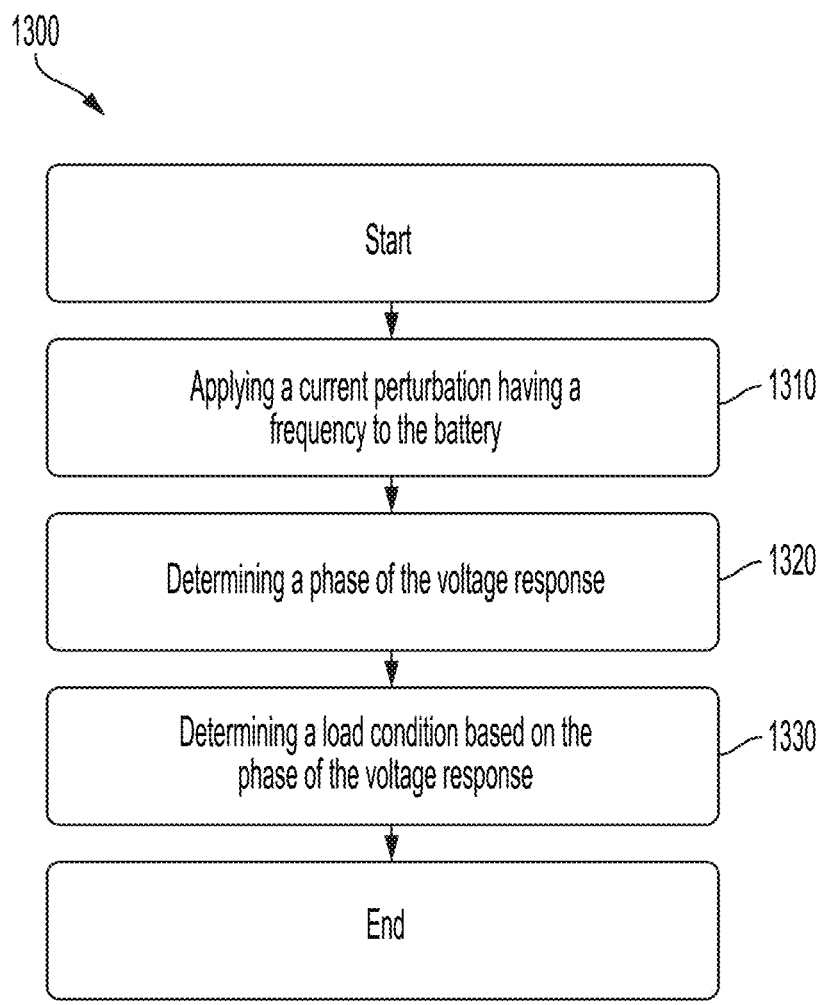
FIG. 13 illustrates a method for determining the load condition of battery, according to a non-limiting embodiment of the present application.

FIG. 13 illustrates method 1300 for determining the load condition of battery, in accordance with some embodiments. Prior to the start of method 1300, an initial load condition of the battery may be determined. For example, the load condition may be measured by a user when the battery is installed and stored in memory. As another example, a user may select an intended time of operation, such as, less than 1 year, between 1 and 5 years, between 5 and 10 years, between 10 and 20 years, or between 20 and 30 years. In some embodiments, method 1300 may be initiated after detecting a temperature within a temperature range of interest and an elapsed time since a last phase of the complex impedance was detected.

Method 1300 starts at stage 1310 by applying a current perturbation having a frequency to the battery. As described above, in reference to stage 910 of FIG. 9, the battery may be a lithium thionyl chloride battery and a single frequency in the range of 1 to 100 Hz may be used to determine the load condition of the battery.

Next at stage 1320, a phase of the impedance response of the battery to the applied current perturbation is determined. As described above, in reference to stage 920 of FIG. 9, a suitable detector may detect a complex impedance of the voltage response of the battery to the current perturbation and the phase of the voltage response may be determined by a processor that receives a signal indicative of the phase of the voltage response.

In some embodiments, a temperature associated with the phase response of the impedance may additionally be detected. A sensor configured to detect an instantaneous temperature of the battery or of the ambient temperature of the load device in connection with determining the phase of the impedance response. The temperature may be detected as part of method 1300 or may be detected separate from method 1300 and stored in memory.

Next at stage 1330, a load condition for the battery is determined. The load condition may be determined using the phase of the impedance response of the battery to the applied current perturbation. For a lithium thionyl chloride battery, size AA cylindrical cell, a normal load may be considered less than 9 mA and a high load may be consider greater than 10 mA. For loads between 9 mA and 10 mA, dual behavior may be exhibited. With a high SOC (e.g., SOC>0.5) the phase of the impedance response of the battery may follow a trend associated with a normal load condition. With a low SOC (SOC<0.5) the phase of the impedance response of the battery may follow a trend associated with a high load condition.

The load condition may be determined using a look up table for the values of the phase response and an initial load condition, in accordance with some embodiments. As described above, and absent damage to the battery, the phase response follows either a normal load trend or a high load trend. Therefore, when an initial load condition is known, or has been determined, a measured phase response can be referenced against a look up table that contains values for each trend and a load condition of the battery can be identified.

Alternatively, or additionally, a measured phase response can be analyzed using an equation based on the determined trends for normal versus high load conditions. The equations may be fit to a series of measured phase responses to determine the load condition of the battery or the equations may use the initial load condition to predict values of the phase based on the behavior for a normal load versus a high load to determine the load condition of the battery. In some embodiments, the look up table and/or an equation used to determine the load condition of the battery may include corrections or additional variables to account for the temperature associated with the phase of the impedance response.

In some embodiments, stages 1310 and 1320 may be repeated multiple times before the load condition is determined. In response to an intended time of operation, an initial period, corresponding to approximately 10-20% of the intended time of operation, may be used to measure the phase of the voltage response and determine an initial load condition of the battery. For example, for a lithium thionyl chloride battery installed in a utility meter with an intended use of 10 years, the first year may be used to determine the initial load condition of the battery. Accordingly, the phase of the voltage response may be determined 5 times, 10 times, or 15 times during the first year, in accordance with some embodiments. After the voltage response determinations have been collected, the measurements may be compared against a look up table to determine if the initial load matches an initial normal load or an initial high load. During the determination of the initial load condition, fewer than 5 determinations of the phase of the voltage response, or greater than 15 determination of the phase of the voltage response may be used to determine the initial load condition, as aspects of the technology described herein are not limited in this respect.

Method 1300 ends when the load condition is determined. Following the competition of method 1300, the method may begin again after a time interval has concluded. For example, as described above, the load condition measurement may repeat hourly, daily, yearly, or once every two years.

Faulty Battery Detection

As has been described above, the phase response of a battery to an applied frequency may exhibit a strong correlation with SOC for the types of batteries described herein. Given that, it is possible to provide early failure detection for batteries by monitoring the evolution of the phase response over time. The evolution of the phase response for a typical lithium thionyl chloride battery follows one of two trends, either normal load condition or high load condition. If the phase evolution of the battery does not follow either normal load or high load trend, then the battery is not typical and is at risk of early failure.

Figure 14:
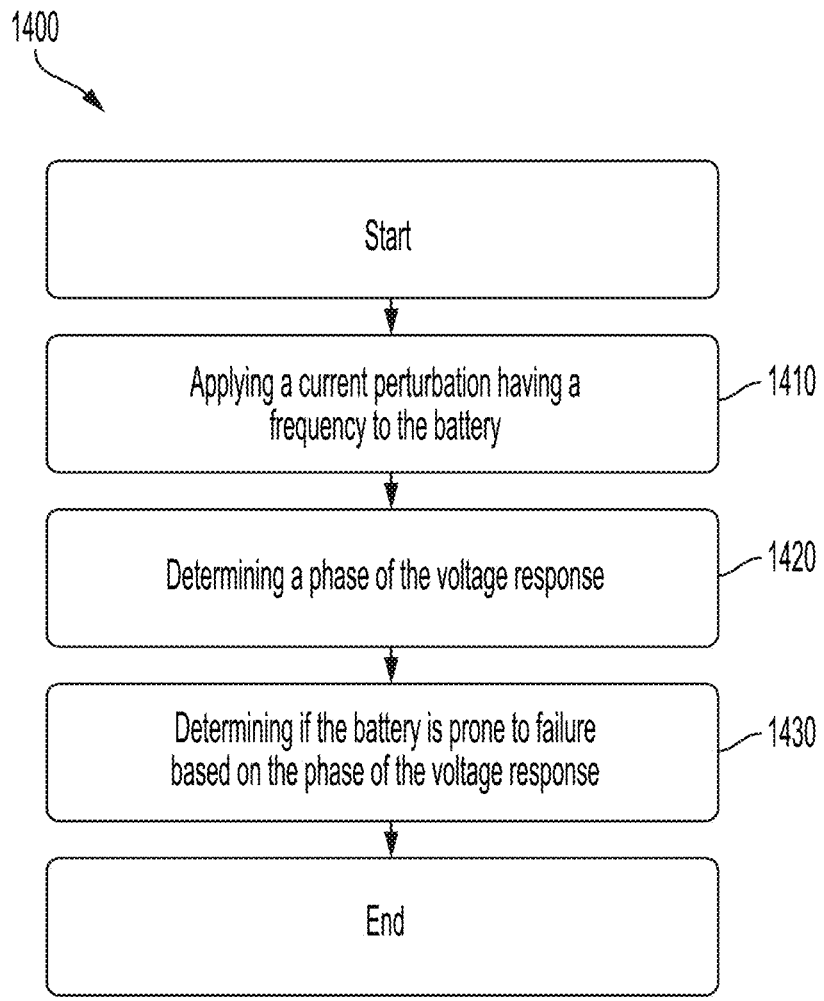
FIG. 14 illustrates a method for early failure detection of a battery, according to a non-limiting embodiment of the present application.

FIG. 14 illustrates a method 1400 for early failure detection of a battery, in accordance with some embodiments. Prior to the start of method 1400, previously measured values of the complex impedance may be used to predict an expected value for the complex impedance based on the load condition. As described above, the phase of the complex impedance is expected to follow either the trend for the normal load condition or the trend for the high load condition, therefore measured values of the phase and the load condition may be used to generate expected values for the phase. For example, an empirically determined equation that represents the dependence of the phase on the SOC for the expected load condition may be extrapolated to expected values for the measured phase as the battery continues to discharge. The expected values may be stored in memory for comparison with measured values.

Method 1400 starts at stage 1410 by applying a current perturbation having a frequency to the battery. As described above, in reference to stage 910 of FIG. 9, the battery may be a lithium thionyl chloride battery and a single frequency current perturbation in the range of 1 to 100 Hz may be used to determine the load condition of the battery. However, other types of batteries may be used in some embodiments.

Next at stage 1420, a phase of the impedance response of the battery to the applied current perturbation is determined. As described above, in reference to stage 920 of FIG. 9, a suitable detector may detect a voltage response of the battery to the current perturbation and the phase of the voltage response may be determined by a processor that receives a signal indicative of the phase of the voltage response.

Next at stage 1430, the phase of the impedance response of the battery is used to determine if the battery is prone to early failure. To determine if the battery is prone to early failure, the phase of the impedance response may be compared to the expected values corresponding to a normal load or a high load condition, as described above in connection with stage 1330 of FIG. 13. If the phase of the impedance response of the battery matches the expected values, then the battery may be identified as healthy in terms of not being prone to early failure. By contrast, if the phase of the impedance response of the battery does not match the expected values for either the normal load or the high load condition, then the battery may be identified as being prone to early failure. In some embodiments, the phase response of the impedance may be compared to a look up table corresponding to the normal load and high load conditions. In other embodiments, the phase response of the impedance may be compared to equations based on the trends for evolution of the phase response of the impedance over time for the normal load and high load conditions.

In some embodiments, an instantaneous temperature associated with the phase of the impedance response is used to determine if the phase of the impedance response of the impedance is consistent with a normal or high load condition of the battery.

After determining if the battery is prone to early failure, method 1400 ends. Following the determination that the battery is prone to failure, an alert indicator may be activated to indicate to a technician that the battery should be inspected and/or replaced prior to failure.

Aspects of the present application provide a sensor which may be used in connection with the methods described above in connection with FIGS. 13 and 14. The sensor may be configured to detect a load condition of the battery and provide early failure detection using the phase of the impedance response of the battery to a frequency perturbation, in accordance with some embodiments.

Figure 15:
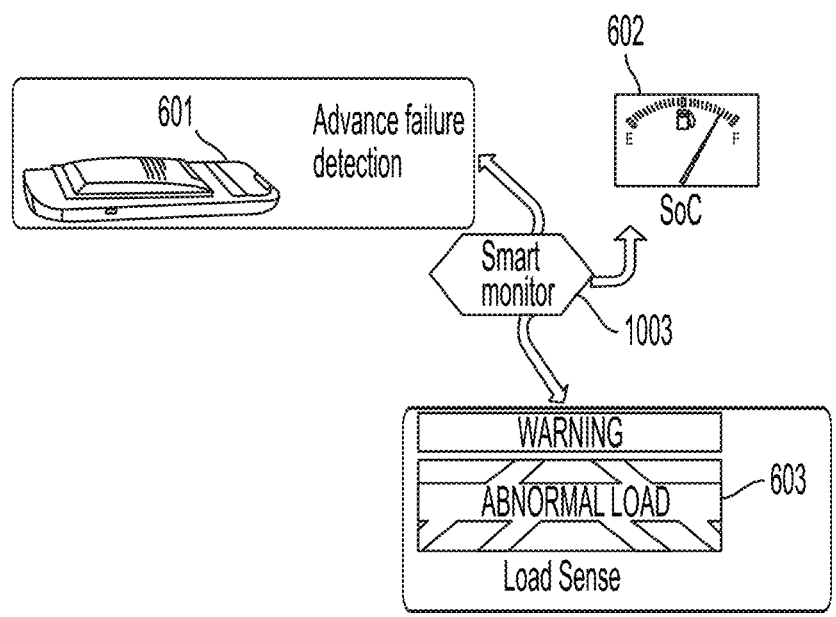
FIG. 15 illustrates a sensor system according to a non-limiting embodiment of the present application.

FIG. 15 illustrates graphical user interface notifications that may be provided to a user in connection with a sensor system to determine SOC, detect a load on the battery, and/or provide advanced failure detection according to a non-limiting embodiment of the present application. The illustrated embodiment shows a smart monitor 1003 that is configured to determine SOC, load detection, and advanced failure detection, in accordance with aspects of the technology described herein. As shown in FIG. 15, the smart monitor may be further configured to provide visual indicator to a user interface to indicate a condition of the battery. For example, when determining the SOC of the battery, a meter 602 may be output on the interface reflecting the SOC. The SOC may be indicated visually as a value between empty and full. When determining a load of the battery to be abnormal, an abnormal load warning indicator 603 may be output to the user interface. When determining if the battery may be susceptible to failure, a graphical indicator of a faulty battery 601 may be output to the user interface. Other indicators may be used, as aspects of the technology described herein are not limited in this respect.

Figure 16:
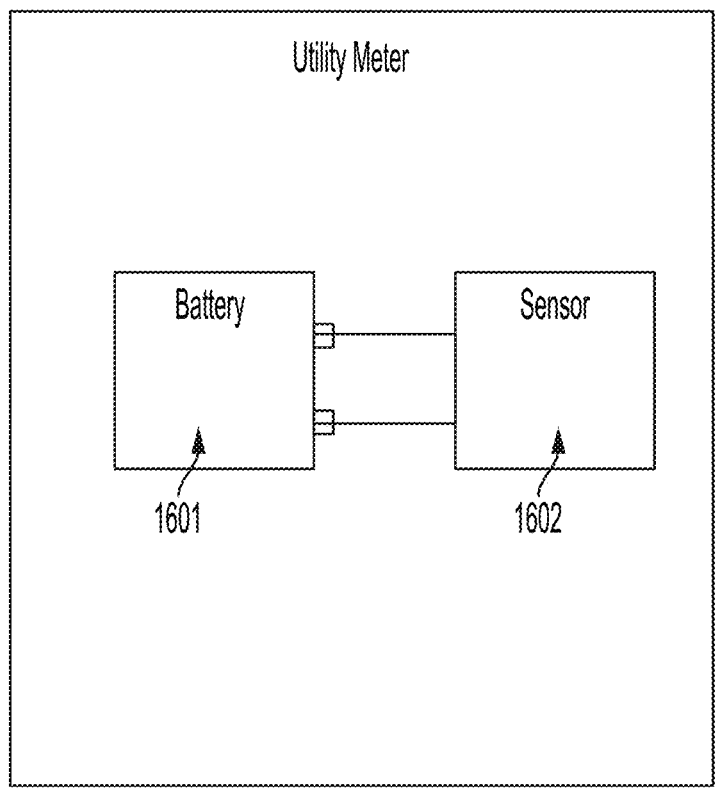
FIG. 16 illustrates a utility meter according to a non-limiting embodiment of the present application.

FIG. 16 illustrates a utility meter according to a non-limiting embodiment of the present application. The utility meter is powered by battery 1601. Sensor 1602 is built into the utility meter for measuring the phase response of the battery to an applied frequency. Using the measured phase response, the sensor monitors the state of charge, detects the load, and provides advanced failure detection. The sensor can be set to measure the phase either at an interval or on demand. The battery 1601 can be exchanged at the end of its operational life for a new battery at which time the sensor can be reconfigured to begin monitoring the new battery. The sensor does not need to be replaced with the battery but can simply be reset thus allowing a single sensor to remain configured to the utility meter throughout the utility meter's operation lifetime.

Additional Components of the Complex Impedance

Some aspects of the technology described above for determining the SOC, load condition, and detecting faulty batteries have been discussed with respect to the phase of the complex impedance. However, other components of the complex impedance may be used in place of, or in addition to, the phase of the complex impedance. For example, the magnitude of the complex impedance, real component of the complex impedance, and/or the imaginary component of the complex impedance may be used in place of, or in addition to, the phase of the complex impedance. For example, the imaginary component of the complex impedance may be used to determine the SOC. The aspects above describing the relationships between the phase of the complex impedance and the SOC, load condition, and early failure detection, in connection with FIGS. 1-16, also apply to the imaginary component of the complex impedance. For example, the relationship between the imaginary component of the complex impedance and the SOC is also monotonic, as will be discussed further below. Therefore, methods and sensor/systems, that utilize the advantages associated with the monotonic relationship between the phase of the complex impedance and the SOC, may also use the imaginary component of the complex impedance in addition to or in place of the phase of the complex impedance.

Figure 17:
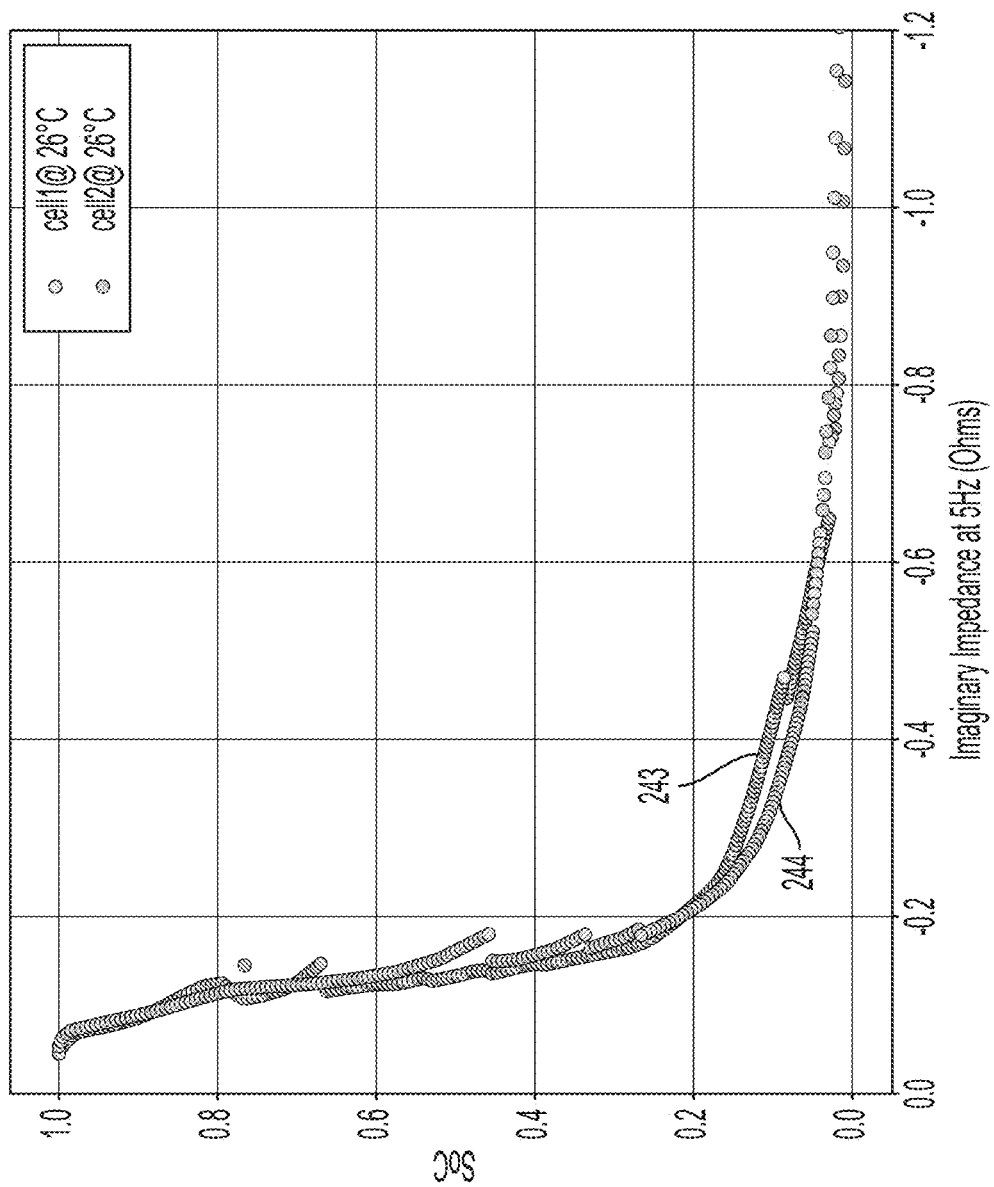
FIG. 17 illustrates the relationship between the imaginary component of the complex impedance and the state of charge for multiple batteries at the same temperature.

FIG. 17 illustrates experimental data of the relationship between the imaginary component of the complex impedance and the SOC for multiple batteries at the same temperature. Curve 243 corresponds to a first lithium thionyl chloride battery and curve 244 corresponds to a second lithium thionyl chloride battery. Both the first and second batteries were AA size cylindrical cells with a nominal voltage of 3.6 V and a capacity of 2600 mAh. The batteries were kept at approximately 26 degrees Celsius and discharged at a constant current of 5 mA from an initial voltage of 3.7 V to a final voltage of 3.0 V. Complex impedance measurements to monitor the state of charge were taken once an hour using a sinusoidal excitation with a frequency of 5 Hz and an AC peak-to-peak amplitude of 12 mA was used for the impedance measurement. In FIG. 17, the SOC is defined to be 1 when the battery is new and 0 when the terminal voltage has reached 3V. As shown by the overlap of curve 243 and 244, the relationship between the imaginary component of a voltage signal response to application of a current perturbation and the state of charge is monotonic and reproducible for lithium thionyl chloride batteries of the same size.

Figure 18:
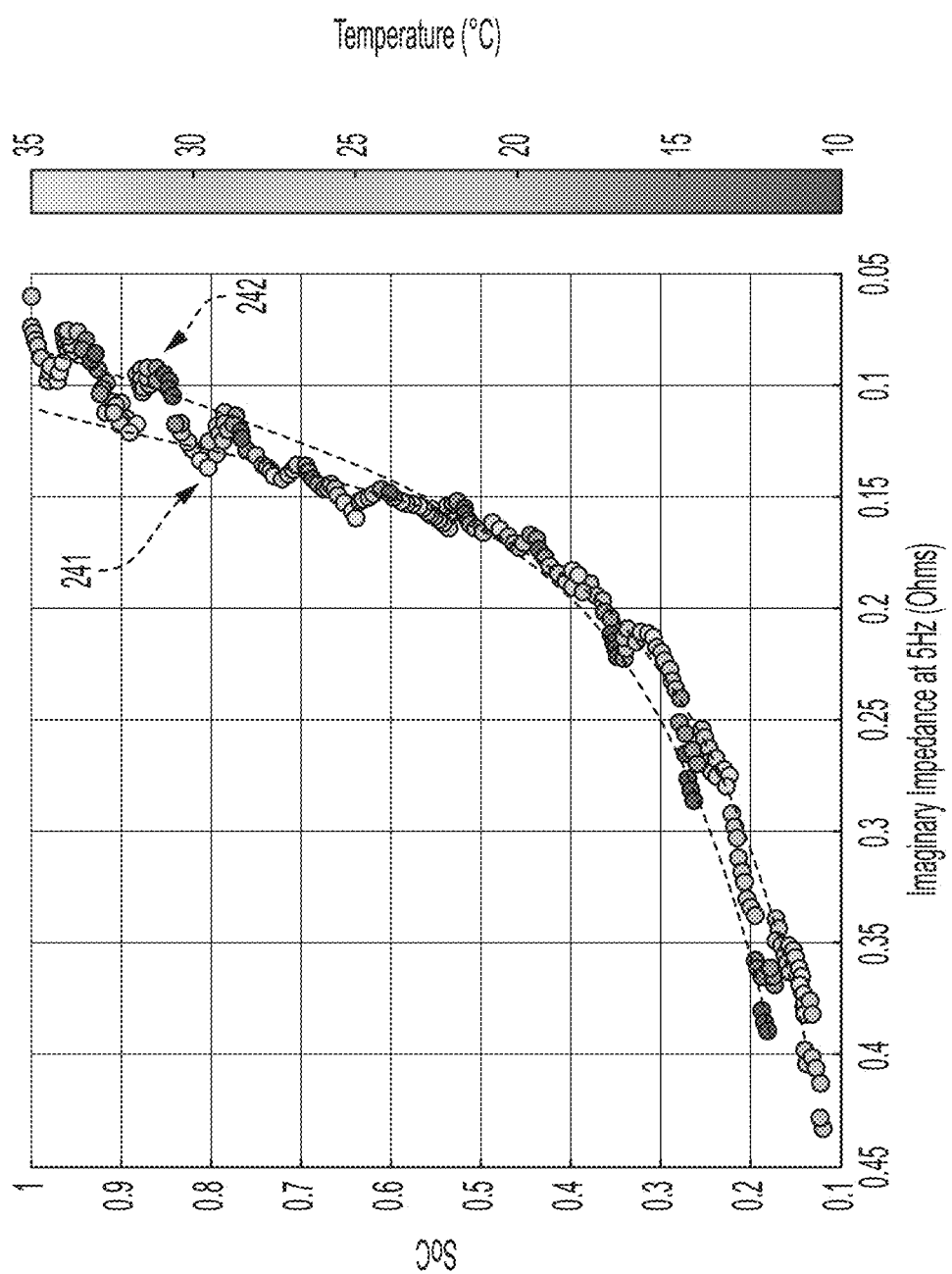
FIG. 18 illustrates the relationship between the imaginary component of the complex impedance to the state of charge, according to a non-limiting embodiment of the present application.

FIG. 18 illustrates experimental data of the relationship between the imaginary component of the complex impedance and the SOC. A lithium thionyl chloride battery, AA size cylindrical cells with a nominal voltage of 3.6 V and a capacity of 2600 mAh, was discharged in a temperature-controlled chamber at a constant current of 5 mA until the terminal voltage reached 3V. While discharging, the temperature of the chamber was changed randomly between 10° C. and 35° C. As shown in FIG. 18, the measurements of the imaginary component of the complex impedance is monotonic with respect to the SOC as indicated by curves 241 and 242. Curve 241 represents the monotonic relationship at 35 degrees Celsius between the imaginary component of the complex impedance and SOC; curve 242 represents the monotonic relationship at 10 degrees Celsius between the imaginary component of the complex impedance and SOC.

Figure 19:
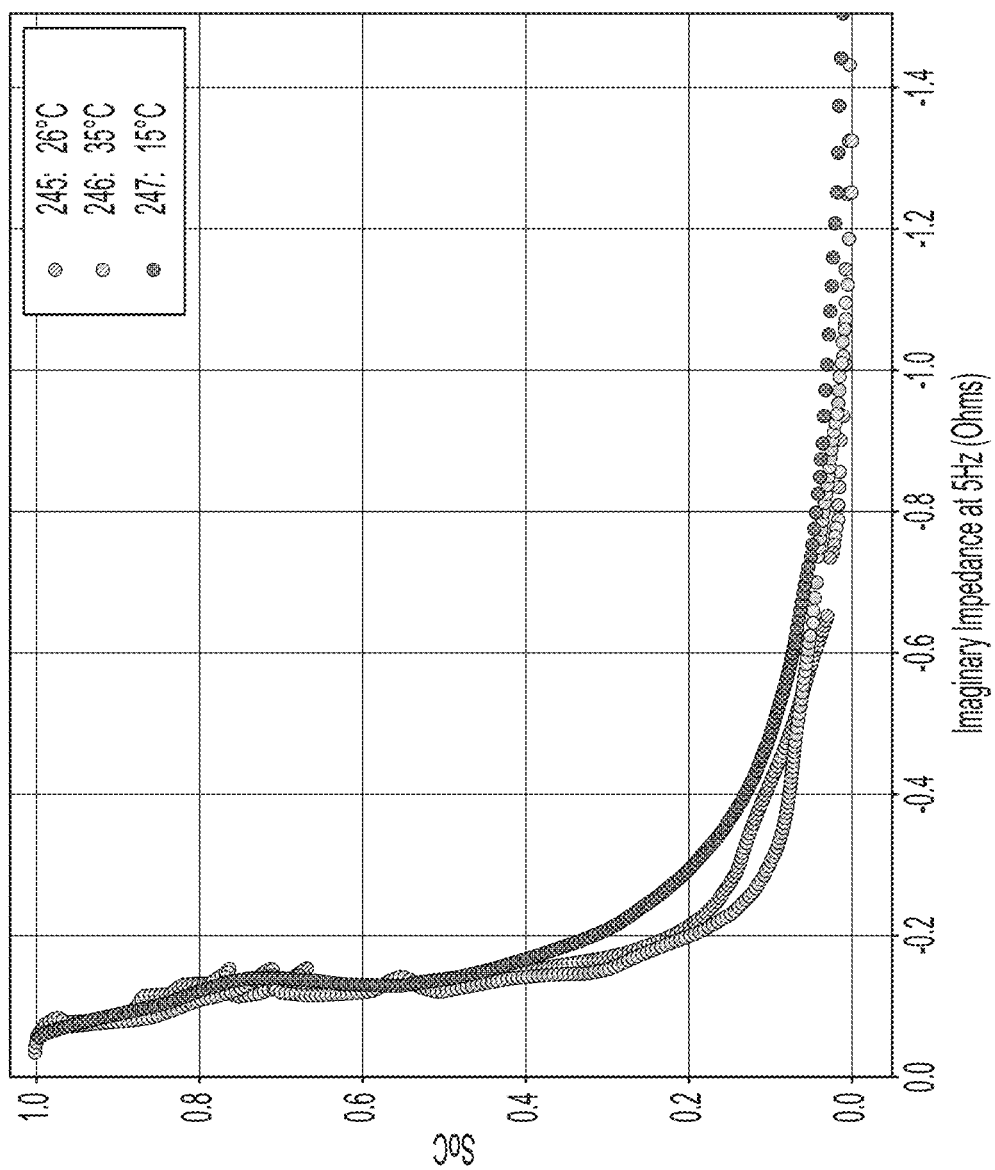
FIG. 19 illustrates the relationship between the imaginary component of the complex impedance and the state of charge for multiple batteries at different temperatures.

FIG. 19 illustrates experimental data of the relationship between the imaginary component of the complex impedance and the SOC for multiple batteries at different temperatures. Curve 245 corresponds to a first lithium thionyl chloride battery at 26.5 degrees Celsius; curve 246 corresponds to a second lithium thionyl chloride battery at 35 degrees Celsius; and curve 247 corresponds to a third lithium thionyl chloride battery at 15 degrees Celsius. Each of the three batteries were AA size cylindrical cells with a nominal voltage of 3.6 V and a capacity of 2600 mAh. The three batteries were discharged in separate temperature-controlled chambers at a constant current of 5 mA until the terminal voltages reached 3 V. The impedance measurements for curves 245, 246, and 247 were taken once every hour. As shown in FIG. 19, at each temperature, the relationship between the state of charge and the imaginary component of the complex impedance of the voltage signal response to application of a current perturbation is monotonic.

Therefore, as described above, with reference to determining the SOC from the phase of the complex impedance in FIGS. 1-16, the SOC can be similarly be determined from the imaginary component of the complex impedance and the temperature at the time of measurement. The same processes as described above apply equally to the imaginary component of the complex impedance, as evidenced by FIGS. 17-19.

The inventors have recognized and appreciated that each component of the complex impedance may have a different response depending on the condition of the battery, despite following similar monotonic trends in relation to the SOC. Therefore, the use of a first component of the complex impedance during a first portion of the lifetime of the battery and a second component during a second portion of the lifetime of the battery may provide advantages, such as decreasing the power consumption of the SOC determination process or increasing accuracy of the SOC determination process. For example, at some SOC values, the imaginary component of the complex impedance may be less dependent on the temperature at the time of measurement, relative to other components of the complex impedance. Therefore, the imaginary component may provide a more energy efficient, and/or accurate determination of the SOC, for some applications. However, at some SOC values, the phase of the complex impedance may provide a more accurate determination of the SOC. Therefore, the inventors have developed methods where more than one component of the complex impedance may be used to determine the SOC. In some embodiments, a combination of multiple components of the complex impedances may be used to determine SOC. For example, the phase and the imaginary component of the complex impedance may both be determined and may both be used to determine the SOC.

In some embodiments, a first component of the complex impedance may be used during a first portion of the lifetime of the battery and, once the SOC drops to a predetermined value, a second component of the complex impedance may be used during a second portion the lifetime of the battery. For example, the imaginary component of the complex impedance may be used to determine the SOC when the SOC is between 1 and 0.5. Once the battery reaches a SOC of 0.5, the phase of the complex impedance may be used to determine the SOC. In other embodiments, the transition between which components of the complex impedance is used to determine SOC may be a SOC between 0.3 and 0.7. The transition between which components of the complex impedance is used to determine the SOC may occur at other values of the SOC, as aspects of the technology described herein are not limited in this respect.

Some aspects of the technology described above for determining the SOC, load condition, and detecting faulty batteries have been discussed with respect to lithium thionyl chloride size AA batteries. However, other battery chemistries and/or sizes of batteries may also be used. Therefore, the frequency used for probing the SOC may depend, at least in part, on the type of non-rechargeable battery, in accordance with some embodiments. Additionally, or alternatively, the frequency used for probing the SOC may depend, at least in part, on determining the size of the battery.

All definitions, as defined and used herein, should be understood to control over dictionary definitions, definitions in documents incorporated by reference, and/or ordinary meanings of the defined terms.

Embodiments have been described where the techniques are implemented in circuitry and/or computer-executable instructions. It should be appreciated that some embodiments may be in the form of a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Various aspects of the embodiments described above may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects describe in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

What is claimed is:

1. A method of identifying a load condition of a non-rechargeable battery, the method comprising:
    applying a current perturbation having a set frequency to the non-rechargeable battery;
    detecting a voltage response of the non-rechargeable battery to the current perturbation;
    determining a complex impedance of the voltage response at the set frequency;

determining an initial load condition of the non-rechargeable battery; and identifying, using the complex impedance and the initial load condition of the non-rechargeable battery, the load condition of the non-rechargeable battery.

2. The method of claim 1, wherein determining the initial load condition of the non-rechargeable battery comprises using a look up table for a value of the initial load condition.

3. The method of claim 1, wherein determining the initial load condition of the non-rechargeable battery comprises making a plurality of determinations of a complex impedance at the set frequency during an initial period of operation of the non-rechargeable battery.

4. The method of claim 3, wherein the initial period of operation represents between 10-20% of an intended time of operation.

5. The method of claim 1, wherein, prior to applying the current perturbation to the non-rechargeable battery, detecting that a temperature of the non-rechargeable battery is within a temperature range of interest.

6. The method of claim 1, further comprising identifying a subsequent load condition of the non-rechargeable battery at a repeating time interval for an intended time of operation.

7. The method of claim 1, wherein identifying the load condition of the non-rechargeable battery comprises determining whether the complex impedance indicates that the load condition is a high load condition or a normal load condition.

8. The method of claim 7, wherein the normal load condition draws less than 9 mA during operation of the non-rechargeable battery, and wherein the high load condition draws greater than 10 mA during operation of the non-rechargeable battery.

9. The method of claim 7, wherein determining whether the complex impedance indicates that the load condition is the high load condition or the normal load condition comprises using a look up table for a phase response of the complex impedance and the initial load condition.

10. The method of claim 7, wherein determining whether determining whether the complex impedance indicates that the load condition is the high load condition or the normal load condition comprises:
calculating a first expected value for the complex impedance using a first equation, the first equation being based on a first trend of the complex impedance under the normal load;
calculating a second expected value for the complex impedance using a second equation, the second equation being based on a second trend of the complex impedance under the high load; and
analyzing the complex impedance and the initial load condition using the first equation and the second equation to determine whether the complex impedance is following the first trend or the second trend.

11. The method of claim 1, wherein identifying the load condition of the non-rechargeable battery comprises determining the complex impedance indicates the load condition is neither a high load condition nor a normal load condition and, upon determining that the complex impedance does not indicate that the load condition is either the high load condition or the normal load condition, determining that the non-rechargeable battery is prone to early failure.

12. The method of claim 1, wherein the current perturbation has a frequency between 2-100 Hz.

13. The method of claim 1, wherein the non-rechargeable battery is a Lithium Thionyl Chloride battery, and wherein identifying the load condition on the non-rechargeable battery comprises identifying the load condition of the Lithium Thionyl Chloride battery.

14. A system for identifying a load condition of a non-rechargeable battery, the system comprising:
a frequency generator configured to apply a current perturbation to the non-rechargeable battery at a frequency;
an impedance probe configured to detect a voltage response of the non-rechargeable battery at the frequency;
a processor; and
a non-transitory computer-readable storage medium storing processor-executable instructions that, when executed by the processor, cause the processor to:
apply a current perturbation having a set frequency to the non-rechargeable battery;
detect a voltage response of the non-rechargeable battery to the current perturbation;
determine a complex impedance of the voltage response at the set frequency;
determine an initial load condition of the non-rechargeable battery; and
identify, using the complex impedance and the initial load condition of the non-rechargeable battery, the load condition of the non-rechargeable battery.

15. The system of claim 14, wherein identifying the load condition of the non-rechargeable battery comprises determining whether the complex impedance indicates that the load condition is a high load condition or a normal load condition.

16. The system of claim 14, wherein identifying the load condition of the non-rechargeable battery comprises determining the complex impedance indicates the load condition is neither a high load condition nor a normal load condition and, upon determining that the complex impedance does not indicate that the load condition is either the high load condition or the normal load condition, determining that the non-rechargeable battery is prone to early failure.

17. The system of claim 14, wherein determining the initial load condition of the non-rechargeable battery comprises making a plurality of determinations of a complex impedance at the set frequency during an initial period of operation of the non-rechargeable battery.

18. A system for identifying a load condition of a non-rechargeable battery, the system comprising:
a processor configured to:
apply a current perturbation having a set frequency to the non-rechargeable battery;
detect a voltage response of the non-rechargeable battery to the current perturbation;
determine a complex impedance of the voltage response at the set frequency;
determine an initial load condition of the non-rechargeable battery; and
identify, using the complex impedance and the initial load condition of the non-rechargeable battery, the load condition of the non-rechargeable battery.

19. The system of claim 18, wherein the processor being configured to identify the load condition of the non-rechargeable battery further comprises the processor being configured to determine whether the complex impedance indicates that the load condition is a high load condition or a normal load condition.

20. The system of claim 18, wherein the processor is further configured to identify the load condition of the non-rechargeable battery further comprises the processor being configured to determine the complex impedance indicates the load condition is neither a high load condition nor a normal load condition and, upon determining that the complex impedance does not indicate that the load condition is either the high load condition or the normal load condition, determining that the non-rechargeable battery is prone to early failure.

* * * * *